(12) United States Patent
Kim

(10) Patent No.: US 11,901,314 B2
(45) Date of Patent: Feb. 13, 2024

(54) ELECTRONIC DEVICE

(71) Applicant: Samsung Display Co., Ltd., Yongin-si (KR)

(72) Inventor: Hun-Tae Kim, Seoul (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

(21) Appl. No.: 17/696,095

(22) Filed: Mar. 16, 2022

(65) Prior Publication Data

US 2022/0375880 A1   Nov. 24, 2022

(30) Foreign Application Priority Data

May 21, 2021 (KR) .................. 10-2021-0065780
Jul. 6, 2021 (KR) .................. 10-2021-0088278

(51) Int. Cl.
| | |
|---|---|
| H01L 23/60 | (2006.01) |
| H01L 27/12 | (2006.01) |
| G06F 3/044 | (2006.01) |
| H05K 7/20 | (2006.01) |
| H05K 1/18 | (2006.01) |
| H01L 25/16 | (2023.01) |
| H10K 59/131 | (2023.01) |

(52) U.S. Cl.
CPC ............ *H01L 23/60* (2013.01); *G06F 3/0443* (2019.05); *G06F 3/0446* (2019.05); *H01L 27/124* (2013.01); *H01L 25/167* (2013.01); *H05K 1/189* (2013.01); *H05K 7/20963* (2013.01); *H05K 2201/10128* (2013.01); *H10K 59/131* (2023.02)

(58) Field of Classification Search
CPC ..... G06F 3/0446; G06F 3/0443; H01L 23/60; H01L 27/124; H01L 27/3276; H01L 25/167; H05K 1/189; H05K 7/20963; H05K 2201/10128; H10K 59/131
USPC .......................................... 345/173
See application file for complete search history.

(56) References Cited

U.S. PATENT DOCUMENTS

| | | |
|---|---|---|
| 9,857,506 B2 | 1/2018 | Kim |
| 10,251,291 B2 | 4/2019 | Ahn et al. |
| 10,679,536 B2 | 6/2020 | Lee et al. |

(Continued)

FOREIGN PATENT DOCUMENTS

| | | |
|---|---|---|
| KR | 1020080084350 A | 9/2008 |
| KR | 1020170059543 A | 5/2017 |

(Continued)

*Primary Examiner* — Jimmy H Nguyen
(74) *Attorney, Agent, or Firm* — CANTOR COLBURN LLP

(57) ABSTRACT

An electronic device includes a display module including a display panel including a first area in which a pixel is disposed, a second area adjacent to the first area and bent with respect to an imaginary axis, a data line connected to the pixel, and a first line insulated from the pixel, an optical film, and a bending cover layer and a window module including a glass substrate and a window protective layer including a cover portion disposed on the glass substrate and a protrusion portion protruding from the cover portion. An end of the optical film and an end of the bending cover layer, which faces the end of the optical film, defines a separation area, the data line and the first line overlap the separation area when viewed in a plane, and the protrusion portion overlaps the first line in the separation area when viewed in a plane.

32 Claims, 13 Drawing Sheets

(56) References Cited

U.S. PATENT DOCUMENTS

| | | | |
|---|---|---|---|
| 10,873,043 B2 | 12/2020 | Jin | |
| 11,150,754 B2 | 10/2021 | Lee et al. | |
| 2015/0167177 A1* | 6/2015 | Choi | G06F 3/04164 |
| | | | 216/13 |
| 2017/0287937 A1* | 10/2017 | Ka | G09G 3/3291 |
| 2018/0158894 A1* | 6/2018 | Park | H01L 27/3276 |
| 2019/0214595 A1* | 7/2019 | Park | G06F 3/0443 |
| 2019/0340959 A1* | 11/2019 | Park | H01L 27/3211 |
| 2020/0143722 A1* | 5/2020 | Lee | G09G 3/3291 |
| 2021/0126209 A1* | 4/2021 | Lee | H01L 51/0097 |
| 2022/0059430 A1* | 2/2022 | Ham | H01L 23/3735 |

FOREIGN PATENT DOCUMENTS

| | | |
|---|---|---|
| KR | 1020190006152 A | 1/2019 |
| KR | 1020190135173 A | 12/2019 |
| KR | 1020190140129 A | 12/2019 |
| KR | 1020200010684 A | 1/2020 |
| KR | 1020200049389 A | 5/2020 |

* cited by examiner

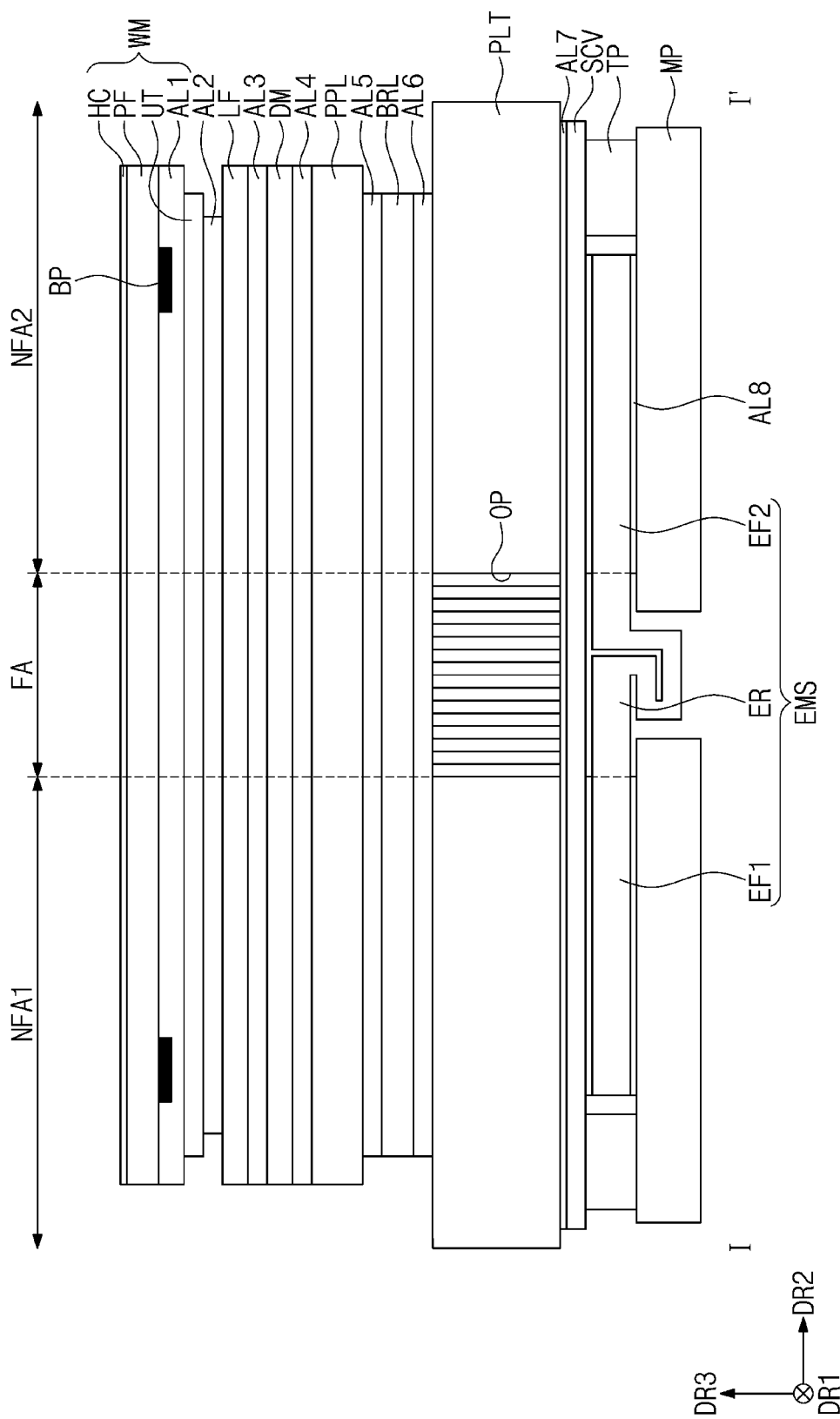

FIG. 12
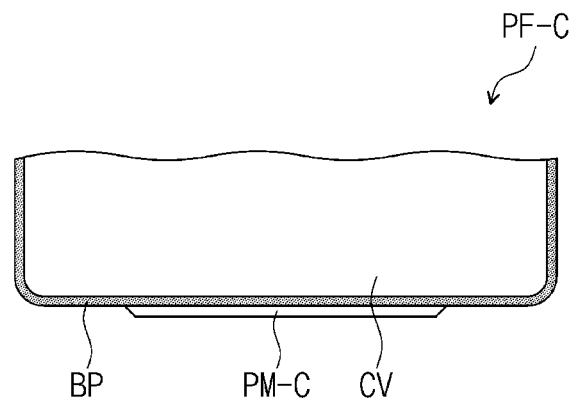
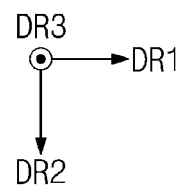
FIG. 13
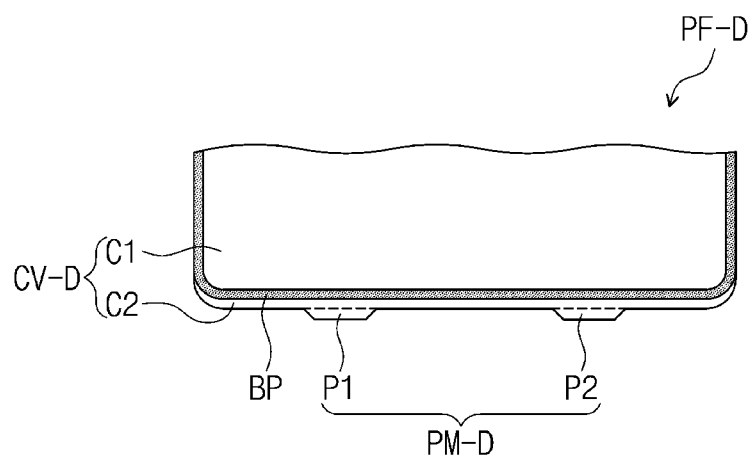
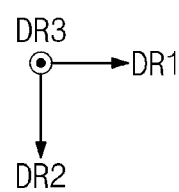

ELECTRONIC DEVICE

This application claims priority to Korean Patent Applications Nos. 10-2021-0065780, filed on May 21, 2021 and 10-2021-0088278, filed on Jul. 6, 2021, and all the benefits accruing therefrom under 35 U.S.C. § 119, the contents of which are hereby incorporated by reference in their entirety.

BACKGROUND

1. Field

The present disclosure relates to a foldable electronic device.

2. Description of the Related Art

An electronic device includes an active area activated in response to an electrical signal. The electronic device senses an input applied thereto from outside of the electronic device, through the active area, and displays various images to provide a user with information. As electronic devices having a variety of shapes are developed, the active area is implemented in various shapes.

SUMMARY

The present disclosure provides a foldable electronic device including an upper member that blocks a path of static electricity flowing in from outside the electronic device.

Embodiments provide an electronic device including a display module including a display panel including a first area in which a pixel is disposed, a second area adjacent to the first area and bent with respect to an imaginary axis extending in a first direction, a data line connected to the pixel and a first line insulated from the pixel, an optical film overlapping at least a portion of the first area, a bending cover layer overlapping at least a portion of the second area, and a window module disposed on the display module and including a glass substrate and a window protective layer including a cover portion disposed on the glass substrate and a protrusion portion protruding from the cover portion to a second direction crossing the first direction. An end of the optical film and an end of the bending cover layer, which faces the end of the optical film, define a separation area, the data line and the first line overlap the separation area when viewed in a plane, and the protrusion portion overlaps the first line in the separation area when viewed in a plane.

The electronic device may further include a second line overlapping the separation area and applying a power voltage to the pixel, and the second line may have a resistance higher than a resistance of the first line.

The display module may further include an input sensing panel disposed on the display panel and including a sensing electrode, a sensing line connected to the sensing electrode, and a crack sensing line insulated from the sensing electrode. The crack sensing line may be connected to the first line via a contact hole defined through the display panel and the input sensing panel.

The first area of the display module may include an active area to which a light generated by the display panel is provided and in which an external input is sensed by the input sensing panel, and a peripheral area adjacent to the active area. The display module may be provided with a hole overlapping the active area and penetrating through the display panel and the input sensing panel.

A portion of the crack sensing line may overlap the peripheral area, and the other portion of the crack sensing line may extend to the active area to surround at least a portion of the hole.

The display module may include a folding area folded with respect to a folding axis extending in the first direction and first and second non-folding areas spaced apart from each other with the folding area interposed therebetween in the second direction, the first area may include the first non-folding area, the folding area, and a portion of the second non-folding area, and the second area may include the other portion of the second non-folding area.

The second line may be spaced apart from the data line with the first line interposed therebetween and may be disposed closer to an outer position of the second area than the first line is.

The protrusion portion may overlap a portion of the bending cover layer in a plane.

The protrusion portion may include a first pattern and a second pattern spaced apart from the first pattern in the first direction.

The protrusion portion may have one of a quadrangular shape, a trapezoidal shape, and a shape including a curve form (e.g., curved shape).

The window protective layer may include a light blocking pattern disposed along an edge of the cover portion.

The cover portion may further include a first cover portion overlapping a border of the light blocking pattern and a second cover portion disposed between the first cover portion and the protrusion portion, and the second cover portion may not overlap the light blocking pattern (e.g., may be exposed outside of the light blocking pattern).

The electronic device may further include a panel protective layer disposed under the display module, a barrier layer disposed under the panel protective layer, a support layer disposed under the barrier layer, a protective layer disposed under the support layer, and a heat dissipation layer disposed under the protective layer.

The display module may further include a folding area defined in the first area and folded with respect to a folding axis extending in the first direction and non-folding areas spaced apart from each other with the folding area interposed therebetween in the second direction, the heat dissipation layer may include flat portions overlapping the non-folding areas and a rolling portion disposed between the flat portions, and the rolling portion may be unfolded when the display module is in a folded state and may be rolled in a predetermined direction when the display module is in an unfolded state.

The electronic device may further include metal plates disposed under the heat dissipation layer, and the metal plates may be spaced apart from each other with the rolling portion interposed therebetween in the second direction.

The electronic device may further include a gap tape disposed between the protective layer and the metal plates to compensate for a step difference of the heat dissipation layer relative to the protective layer and/or the metal plates.

The electronic device may further include a circuit board connected to the pixel, and the circuit board may be connected to an end of the second area spaced apart from the first area of the display panel and may be bent to a direction toward the metal plates with the second area of the display panel.

Embodiments provide an electronic device including a display module including a display panel including a first area including an active area in which a pixel is disposed and a peripheral area adjacent to the active area and a second area adjacent to the first area and bent with respect to an imaginary axis, a first line insulated from the pixel and a second line connected to the pixel, and a bending cover layer overlapping at least a portion of the second area, a window module disposed on the display module and including a glass substrate and a window protective layer including a cover portion disposed on the glass substrate and a protrusion portion protruding from the cover portion to a second direction crossing a first direction and an adhesive layer overlapping at least a portion of the first area and disposed between the window module and the display module. An end of the adhesive layer and an end of the bending cover layer which faces the end of the adhesive layer, define a separation area, the first line has a resistance lower than a resistance of the second line, the first line and the second line overlap the separation area when viewed in a plane, and the protrusion portion overlaps the first line and the second line in the separation area.

The display module may include a data line connected to the pixel and spaced apart from the second line with the first line interposed therebetween.

The display module may further include an input sensing panel disposed on the display panel and including a sensing electrode overlapping the active area, a sensing line overlapping the peripheral area and connected to the sensing electrode, and a crack sensing line insulated from the sensing electrode. The crack sensing line may be connected to the first line via a contact hole overlapping the peripheral area and defined through the display panel and the input sensing panel.

The display module may be provided with a hole overlapping the active area and penetrating through the display panel and the input sensing panel.

A portion of the crack sensing line may overlap the peripheral area, and the other portion of the crack sensing line may extend to the active area to surround at least a portion of the hole.

Embodiments provide an electronic device including a window module including a glass substrate, and a window protective layer including a cover portion disposed on the glass substrate and a protrusion portion protruding from the cover portion to one direction, a display panel disposed under the window module and including a first area, a second area adjacent to the first area and bent with respect to an imaginary axis and a contact line extending to the second area from the first area, an input sensing panel disposed on the display panel and including a sensing electrode, a sensing line connected to the sensing electrode, and a crack sensing line connected to the contact line, an optical film disposed on the input sensing panel and overlapping at least a portion of the first area, and a bending cover layer disposed on the display panel and overlapping at least a portion of the second area. An end of the optical film and an end of the bending cover layer which faces the end of the optical film, define a separation area, the contact line overlaps the separation area when viewed in a plane, and the protrusion portion overlaps the contact line in the separation area when viewed in a plane.

The first area may include an active area in which a pixel is disposed and a peripheral area adjacent to the active area, the display panel may include a power line and a data line which are connected to the pixel and overlap the separation area, and the contact line may be insulated from the pixel and has a resistance lower than a resistance of the power line.

The crack sensing line may be connected to the contact line via a contact hole defined through the display panel and the input sensing panel, which overlaps the peripheral area.

A hole may be defined through the display panel and the input sensing panel, which overlaps the active area, a portion of the crack sensing line may overlap the peripheral area, and the other portion of the crack sensing line may extend to the active area to surround at least a portion of the hole.

According to the above, the protrusion portion of the window protective layer overlaps the separation area defined by the optical film and the bending cover layer spaced apart from each. Thus, a path through which the static electricity from the outside flows in the line having a low resistance is blocked in the separation area by the protrusion portion, and the window module effectively prevents the defects such as short-circuits from occurring due to the static electricity. Accordingly, the electrical characteristics and the folding characteristics of the electronic device are improved.

BRIEF DESCRIPTION OF THE DRAWINGS

The above and other advantages of the present disclosure will become readily apparent by reference to the following detailed description when considered in conjunction with the accompanying drawings where:

FIG. 2 is a cross-sectional view showing an embodiment of an electronic device;

FIG. 12 is a plan view showing an embodiment of a window module; and

FIG. 13 is a plan view showing an embodiment of a window module.

DETAILED DESCRIPTION

Figure 1A:
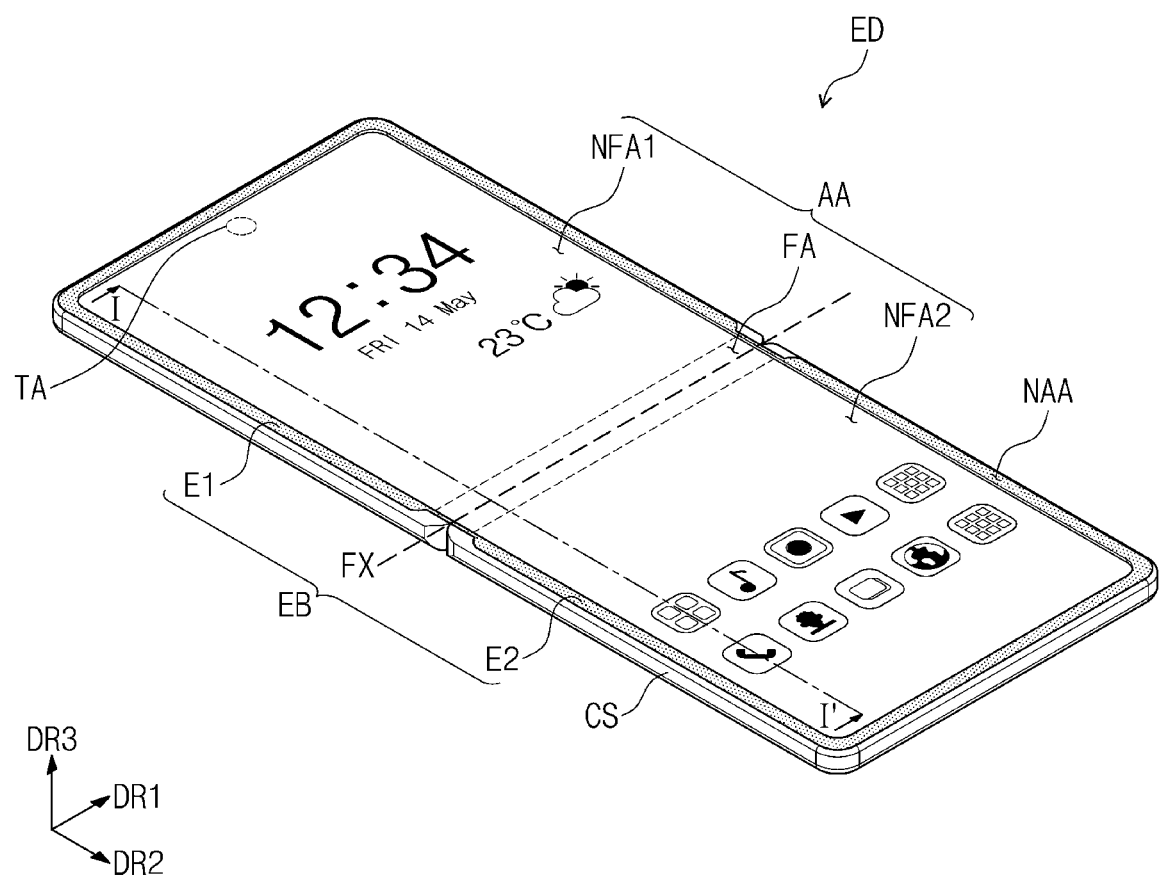
FIG. 1A is a perspective view showing an embodiment of an electronic device which is unfolded.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. In the present disclosure, it will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, a layer or intervening elements or layers is not present.

Like numerals refer to like elements throughout. As used herein, a reference number may indicate a singular element or a plurality of the element. For example, a reference number labeling a singular form of an element within the drawing figures may be used to reference a plurality of the singular element within the text of specification. In the drawings, the thickness, ratio, and dimension of components are exaggerated for effective description of the technical content.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the present disclosure will be explained in detail with reference to the accompanying drawings.

Figure 1B:
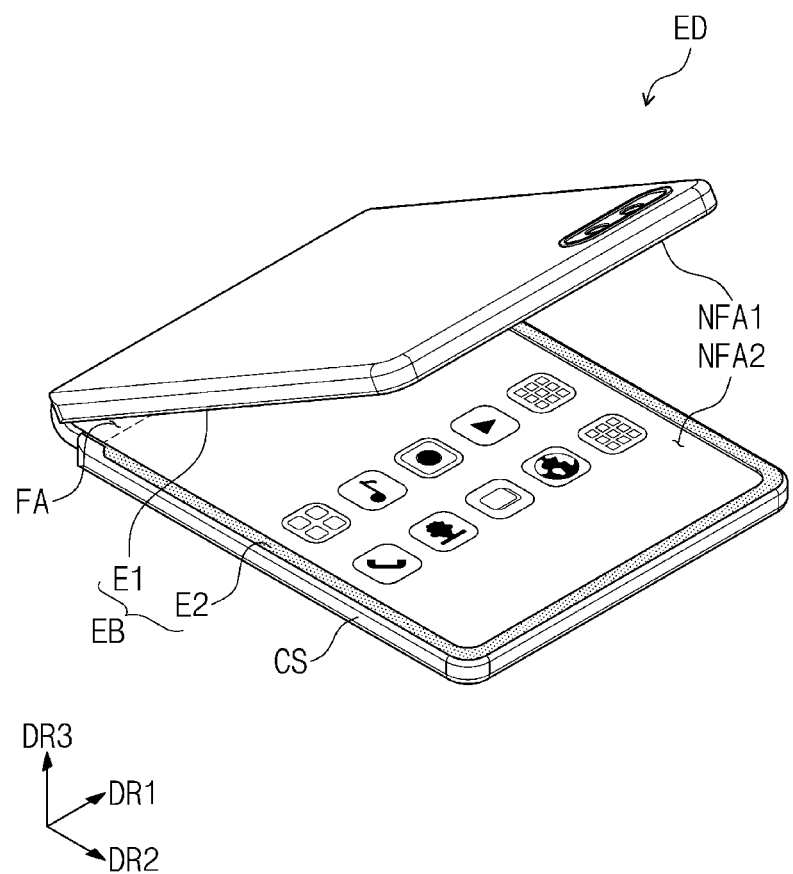
FIG. 1B is a perspective view showing an embodiment of an electronic device which is folded.
Figure 3A:
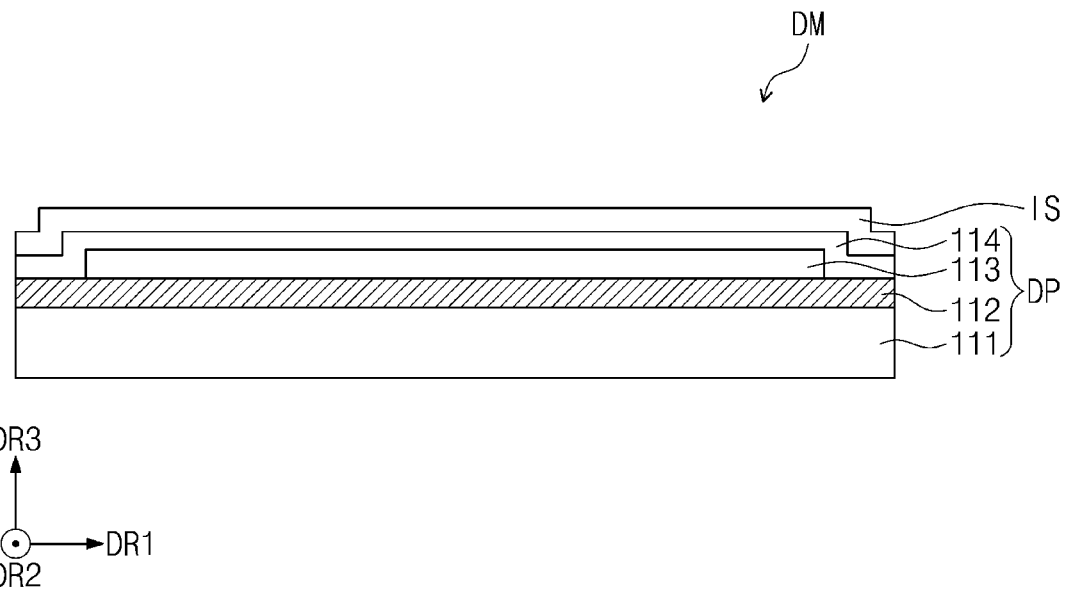
FIG. 3A is a cross-sectional view showing an embodiment of a display module.
Figure 3B:
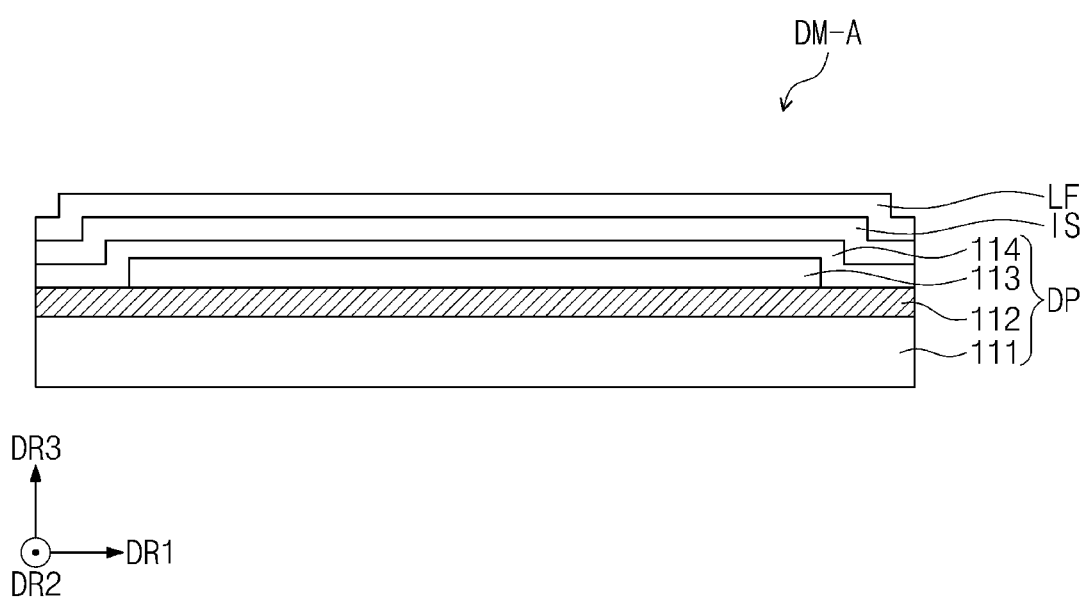
FIG. 3B is a cross-sectional view showing an embodiment of a display module.
Figure 4:
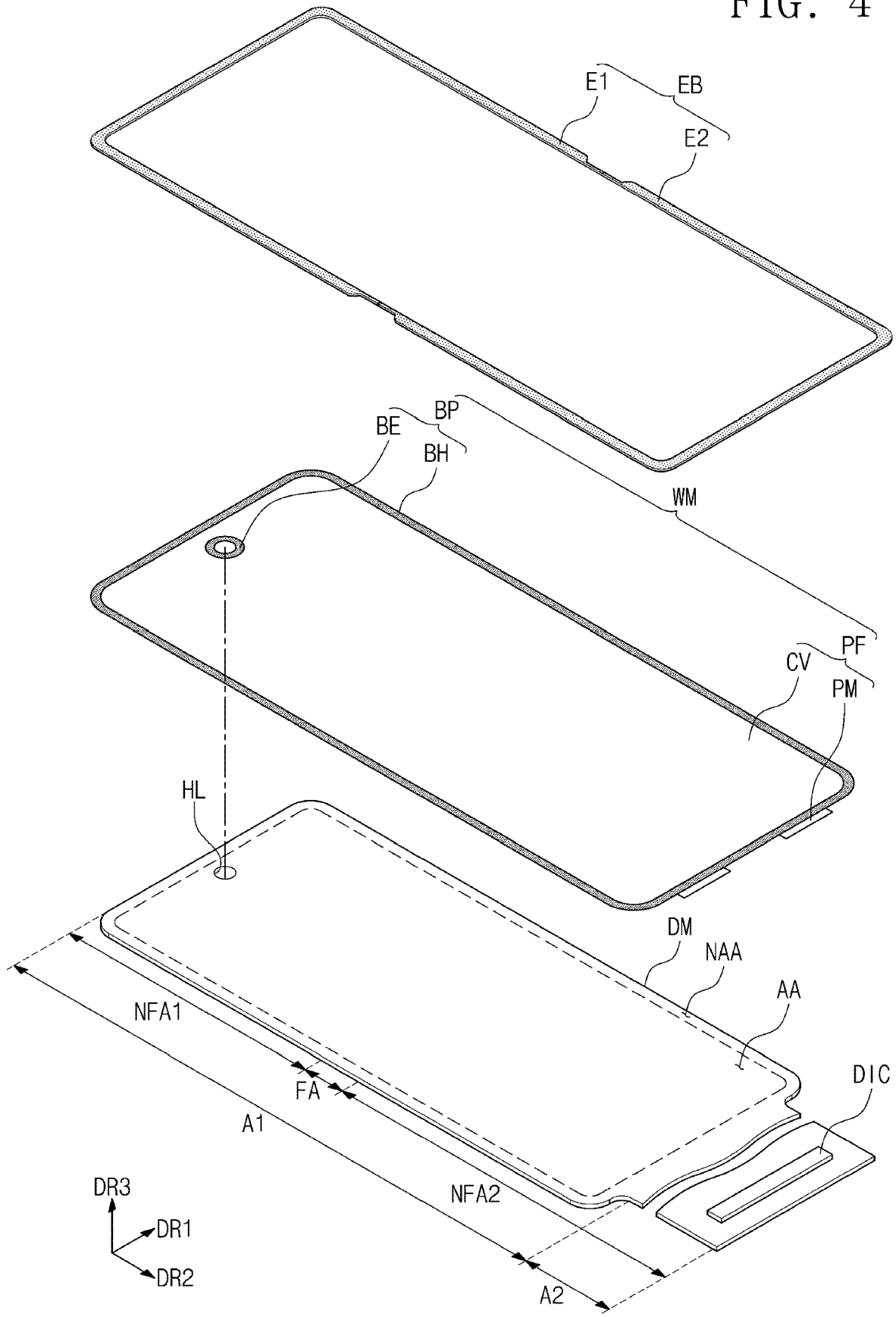
FIG. 4 is an exploded perspective view showing an embodiment of components within an electronic device.

FIG. 1A is a perspective view showing an embodiment of an electronic device ED which is unfolded (e.g., in an unfolded state). FIG. 1B is a perspective view showing an embodiment of the electronic device ED which is folded (e.g., in a folded state). FIG. 2 is a cross-sectional view showing an embodiment of the electronic device ED taken along line I-I' of FIG. 1A. FIG. 3A is a cross-sectional view showing an embodiment of a display module DM. FIG. 3B is a cross-sectional view showing an embodiment of a display module DM-A. FIG. 4 is an exploded perspective view showing an embodiment of components of an electronic device ED.

Referring to FIGS. 1A and 1B, the electronic device ED may be a device that is activated in response to electrical signals. The electronic device ED may be applied to a mobile phone, a tablet computer, a car navigation unit, a game unit, or a wearable device, however, should not be limited thereto or thereby. FIG. 1A shows the mobile phone as a representative example of the electronic device ED.

The electronic device ED may display an image through (or at) an active area AA and may sense an external input through the active area AA. The active area AA may include or be disposed in a plane defined by a first direction DR1 and a second direction DR2 which cross each other in a state in which the electronic device ED is unfolded. A thickness direction of the electronic device ED may be substantially parallel to a third direction DR3 crossing the first direction DR1 and the second direction DR2. Accordingly, front (or upper) and rear (or lower) surfaces of each member of the electronic device ED may be defined with respect to the third direction DR3.

A peripheral area NAA may be adjacent to the active area AA, such as to surround at least a portion of the active area AA. The peripheral area NAA may be defined by (or correspond to) a light blocking pattern BP (refer to FIG. 2) included in a window module WM (refer to FIG. 2) described later. Accordingly, the peripheral area NAA may have a predetermined color. FIG. 1A shows the peripheral area NAA surrounding four sides of the active area AA as a representative example, however, the peripheral area NAA should not be limited thereto or thereby. According to an embodiment, the peripheral area NAA may not be disposed at at least one side of the active area AA, or the peripheral area NAA may be omitted.

The active area AA may include a folding area FA and a non-folding area provided in plural including a plurality of non-folding areas which are spaced apart from each other with the folding area FA interposed therebetween in the second direction DR2. The folding area FA may be folded about a folding axis FX extending in the first direction DR1. The electronic device ED is foldable about the folding axis FX. Various components or layers of the electronic device ED may include an active area AA, a peripheral area NAA, a folding area FA, a non-folding area, etc. respectively corresponding to those described above. Various components or layers of the electronic device ED may be foldable together with each other.

When the electronic device ED is folded, a first non-folding area NFA1 and a second non-folding area NFA2 among a plurality of non-folding areas may face each other. That is, the electronic device ED which is folded disposes the first non-folding area NFA1 and the second non-folding area NFA2 facing each other. Accordingly, when the electronic device ED is fully folded, the active area AA may not be exposed to outside the electronic device ED, and this folding state may be referred to as an "in-folding". However, this is merely one example, and an operation of the electronic device ED should not be limited thereto or thereby.

According to an embodiment, in the electronic device ED which is folded, the first non-folding area NFA1 and the second non-folding area NFA2 may face in opposite directions from each other. Accordingly, the active area AA may be exposed to the outside in the folding state, and this folding state may be referred to as an "out-folding".

The electronic device ED may perform only one of the in-folding and out-folding operations. As another way, the electronic device ED may perform both the in-folding and the out-folding operations. In this case, the same area of the electronic device ED, that is, the folding area FA of the electronic device ED, may be inwardly folded (in-folding) or outwardly folded (out-folding). According to an embodiment, a portion of the electronic device ED may be inwardly folded (in-folding), and the other portion of the electronic device ED may be outwardly folded (out-folding).

FIGS. 1A and 1B show one of the folding area FA and two non-folding areas (e.g., first and second non-folding areas NFA1 and NFA2) as a representative example, however, the number of the folding area FA and the number of the plurality of non-folding areas should not be limited thereto or thereby. In an embodiment, for example, the electronic device ED may include three or more non-folding areas and a plurality of folding areas respectively disposed between respective non-folding areas adjacent to each other.

FIGS. 1A and 1B show the electronic device ED in which the folding axis FX is substantially parallel to a minor axis of the electronic device ED, however, the present disclosure should not be limited thereto or thereby. In an embodiment, for example, the folding axis FX may extend to be substantially parallel to a major axis of the electronic device ED, e.g., a direction substantially parallel to the second direction DR2. In this case, the first non-folding area NFA1, the folding area FA, and the second non-folding area NFA2 may be sequentially arranged in the first direction DR1.

The electronic device ED may further include a signal transmission area TA defined in the active area AA. The signal transmission area TA may have a transmittance (e.g., light transmittance) higher than that of the active area AA and the peripheral area NAA. A natural light, a visible light and/or an infrared light may travel through layers of the electronic device ED at the signal transmission area TA. The electronic device ED may further include a sensor that provides a function to the electronic device ED. In an embodiment, the sensor takes a picture of an external object using the visible light traveling through the signal transmission area TA or determines an approach of the external object using the infrared light.

The electronic device ED may include a bezel pattern EB. A border between the active area AA and the peripheral area NAA may be defined by the bezel pattern EB. That is, an area (e.g., planar area) in which the bezel pattern EB is disposed may correspond to the peripheral area NAA, and an area (e.g., planar area) surrounded by the bezel pattern EB may correspond to the active area AA. The bezel pattern EB may have a predetermined color. As an example, the bezel pattern EB may have a black color.

The bezel pattern EB may be coupled to a case CS and the window module WM (refer to FIG. 2) by an adhesive layer disposed under the bezel pattern EB. Accordingly, the window module WM may be stably coupled to the case CS by the bezel pattern EB.

The bezel pattern EB may include a first pattern E1 and a second pattern E2. The first pattern E1 may overlap (or correspond to) the first non-folding area NFA1, and the second pattern E2 may overlap (or correspond to) the second non-folding area NFA2.

The first pattern E1 may extend along an edge of the window module WM overlapping the first non-folding area NFA1, and the second pattern E2 may extend along an edge of the window module WM overlapping the second non-folding area NFA2.

The electronic device ED may have an outer appearance defined by portions of the case CS, the window module WM, and the bezel pattern EB coupled to the case CS and the window module WM. The case CS may be provided in plural according to the number of the non-folding areas and may further include a hinge structure that connects the cases and is disposed to overlap the folding area FA to allow the electronic device ED to be easily folded.

Referring to FIG. 2, the electronic device ED may include the window module WM, an optical film LF, a display module DM, a panel protective layer PPL, a barrier layer BRL, a support layer PLT, a protective layer SCV, a heat dissipation layer EMS, a metal plate layer including a metal plate MP provided in plural including metal plates MP, a gap tape TP, and adhesive layers AL1 to AL8 that respectively attach the above components to each other. FIG. 2 shows components of the electronic device ED without the case CS and the bezel pattern EB.

The adhesive layers AL1 to AL8 described hereinafter may be a transparent adhesive layer including at least one of a pressure sensitive adhesive (PSA) film, an optically clear adhesive (OCA) film, and an optically clear resin (OCR). In addition, at least one adhesive layer of the adhesive layers AL1 to AL8 may be omitted.

The window module WM may include a glass substrate UT, a window protective layer PF disposed on the glass substrate UT, and the light blocking pattern BP disposed on a lower surface of the window protective layer PF. According to an embodiment, the window protective layer PF may include a plastic film. Accordingly, the window module WM may further include a first adhesive layer AL1 that attaches the window protective layer PF to the glass substrate UT.

The glass substrate UT may have a thickness of about 15 micrometers (μm) to about 45 μm. The glass substrate UT may be chemically strengthened glass. The glass substrate UT may minimize occurrence of creases even when folding and unfolding operations are repeated. The glass substrate UT may transmit light, e.g., transparent substrate.

The window protective layer PF may have a thickness of about 50 μm to about 80 μm. The window protective layer PF may include polyimide, polycarbonate, polyamide, triacetylcellulose, polymethylmethacrylate, or polyethylene terephthalate.

According to an embodiment, the window module WM may include a hard coating layer HC. The hard coating layer HC may be disposed on the window protective layer PF as an outermost layer of the window module WM. The hard coating layer HC may be coated on the window protective layer PF as a functional layer that improves characteristics of use of the electronic device ED. In an embodiment, for example, the hard coating layer HC may improve anti-fingerprint characteristics, anti-pollution characteristics, anti-reflective characteristics, scratch-resistant characteristics, and the like.

The light blocking pattern BP may overlap the bezel pattern EB shown in FIG. 1A shown in FIG. 1A. According to the present embodiment, the light blocking pattern BP may be disposed on or protrude from a surface of the window protective layer PF, which faces the glass substrate UT.

FIG. 2 shows a structure in which the light blocking pattern BP is disposed at an inner side of the electronic device ED, to be spaced apart from an end of the window protective layer PF by a predetermined distance, however, the structure should not be limited thereto or thereby. According to an embodiment, the light blocking pattern BP may be disposed under the window protective layer PF to be aligned with the end of the window protective layer PF, and should not be particularly limited.

The light blocking pattern BP may be a colored light blocking layer and may be formed by a coating method. The light blocking pattern BP may include a base material and a dye or a pigment which is mixed with the base material. Accordingly, the peripheral area NAA of the electronic device ED may be perceived from outside of the electronic device ED, due to a predetermined color of the light blocking pattern BP.

FIG. 2 shows the light blocking pattern BP disposed on the lower surface of the window protective layer PF, however, the light blocking pattern BP should not be limited thereto or thereby. According to an embodiment, the light blocking pattern BP may be disposed on an upper surface of the window protective layer PF or one of upper and lower surfaces of the glass substrate UT.

A second adhesive layer AL2 may attach the window module WM to the optical film LF.

The optical film LF may be disposed between the window module WM and the display module DM. The optical film LF may reduce a reflectance of an external light. The optical film LF may include a retarder and/or a polarizer. The optical film LF may include at least a polarizing film.

The display module DM may be disposed between the optical film LF and the panel protective layer PPL. The display module DM may have a structure which generates an image and/or senses an input applied thereto from the outside. As an example, the display module DM may include a display panel DP and an input sensing panel IS.

A third adhesive layer AL3 may attach the optical film LF to the display module DM.

Referring to FIG. 3A, the display panel DP may include a configuration that substantially generates the image, emits light, etc. The display panel DP may be, but not limited to, an organic light emitting display panel, a quantum dot display panel, or an inorganic light emitting display panel.

The display panel DP may include a base layer 111, a circuit element layer 112, a display element layer 113, and an encapsulation layer 114.

The base layer 111 may include a synthetic resin film. The synthetic resin film may include a heat-curable resin. The base layer 111 may have a multi-layer structure. For instance, the base layer 111 may have a three-layer structure of a synthetic resin layer, an adhesive layer, and a synthetic resin layer. The synthetic resin layer may be a polyimide-based resin layer, however, the material for the synthetic resin layer should not be particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer 111 may include a glass substrate or an organic/inorganic composite substrate.

The circuit element layer 112 may be disposed on the base layer 111. The circuit element layer 112 may include an insulating layer, a semiconductor pattern, a conductive pattern, and a signal line. An insulating layer, a semiconductor layer, and a conductive layer may be formed on the base layer 111 by a coating or depositing process. Then, the insulating layer, the semiconductor layer, and the conductive layer may be selectively patterned by a plurality of photolithography processes. The semiconductor pattern, the conductive pattern, and the signal line included in the circuit element layer 112 may be formed.

The display element layer 113 may be disposed on the circuit element layer 112. The display element layer 113 may include a light emitting element. In an embodiment, for example, the display element layer 113 may include an organic light emitting material, a quantum dot, a quantum rod, or a micro light-emitting diode (micro-LED).

The encapsulation layer 114 may be disposed on the display element layer 113. The encapsulation layer 114 may include an inorganic layer, an organic layer, and an inorganic layer, which are sequentially stacked, however, layers included in the encapsulation layer 114 should not be limited thereto or thereby.

The inorganic layers may protect the display element layer 113 from moisture/oxygen, and the organic layer may protect the display element layer 113 from a foreign substance such as dust particles. The inorganic layers may include a silicon nitride layer, a silicon oxynitride layer, a silicon oxide layer, a titanium oxide layer, or an aluminum oxide layer. The organic layer may include an acrylic-based organic layer, however, should not be limited thereto or thereby.

The input sensing panel IS may be disposed on the display panel DP. The input sensing panel IS may sense an external input applied thereto from outside the display module DM. In an embodiment, for example, the external input may include a variety of external inputs, such as contact from or proximity of a part of a body, light, heat, pen, or pressure.

The input sensing panel IS may be formed on the display panel DP through successive processes. In this case, it may be expressed that the input sensing panel IS is disposed directly on the display panel DP. The expression that a component "B" is disposed directly on a component "A" means that no intervening elements are present between the component "B" and the component "A". That is, a separate adhesive member may not be disposed between the input sensing panel IS and the display panel DP.

In addition, according to an embodiment, the input sensing panel IS may be provided as a separate module from a remainder of the display module DM, and may be combined with the display panel DP by an adhesive member. The adhesive member may include an ordinary adhesive.

Referring to FIG. 3B, the display module DM-A may further include an optical film LF disposed on an input sensing panel IS. In this case, the optical film LF and the third adhesive layer AL3 described with reference to FIG. 2 may be omitted from an electronic device ED including the display module DM-A.

The panel protective layer PPL may be disposed under the display module DM. The panel protective layer PPL may be disposed under the display module DM to protect the display module DM. The panel protective layer PPL may include a flexible plastic material. As an example, the panel protective layer PPL may include polyethylene terephthalate.

FIG. 2 shows a structure in which the panel protective layer PPL overlaps (or corresponds to) each of the folding area FA and the first and second non-folding areas NFA1 and NFA2, however, the present disclosure should not be limited thereto or thereby. According to an embodiment, the panel protective layer PPL may include two protective layers or protective layer patterns that do not overlap the folding area FA and respectively overlap the non-folding areas NFA1 and NFA2. The protective layer patterns which do not overlap the folding area FA may be spaced apart from each other in a direction along the display module DM, at the folding area FA.

A fourth adhesive layer AL4 may attach the display module DM to the panel protective layer PPL.

The barrier layer BRL may be disposed under the panel protective layer PPL. The barrier layer BRL may increase a resistance to a compressive force caused by external pressure. Accordingly, the barrier layer BRL may prevent the display module DM from being deformed. The barrier layer BRL may include a flexible plastic material, such as polyimide or polyethylene terephthalate. In addition, the barrier layer BRL may be a colored film with low light transmittance. The barrier layer BRL may absorb a light incident thereto from the outside. As an example, the barrier layer BRL may be a black plastic film. Accordingly, when looking at the electronic device ED from the above of the window protective layer PF, components disposed under the barrier layer BRL may not be visible from outside the electronic device ED.

A fifth adhesive layer AL5 may attach the panel protective layer PPL to the barrier layer BRL.

The support layer PLT may be disposed under the barrier layer BRL. The support layer PLT may support components disposed above the support layer PLT and may maintain the unfolded state and the folded state of the display module DM. In addition, a heat dissipation performance of the electronic device ED may be improved by the support layer PLT.

An opening OP provided in plural including a plurality of openings OP may be defined in an area of the support layer PLT, which overlaps the folding area FA. Accordingly, a shape of the support layer PLT overlapping the folding area FA may be easily changed due to the openings OP. The openings OP may extend into a thickness of the support layer PLT, such as into a partial thickness or through an entire thickness (e.g., extended through the support layer PLT).

The support layer PLT may be provided as a conductive plate. As an example, the support layer PLT may include a metal material such as a stainless steel. In this case, the support layer PLT may include SUS 304, however, should not be limited thereto or thereby. That is, the support layer PLT may include a variety of metal materials. In addition, the support layer PLT may be provided as a non-conductive plate. In this case, the support layer PLT may be provided as a plate with carbon fiber, however, should not be particularly limited.

A sixth adhesive layer AL6 may attach the barrier layer BRL to the support layer PLT.

The protective layer SCV may be disposed under the support layer PLT. The protective layer SCV may cover the openings OP defined through the support layer PLT. The protective layer SCV may have a lower elastic modulus than that of the support layer PLT. As an example, the protective layer SCV may include thermoplastic polyurethane, rubber, or silicone, however, should not be limited thereto or thereby. In addition, the protective layer SCV may be manufactured in the form of a sheet and may be attached to a lower portion of the support layer PLT.

A seventh adhesive layer AL7 may attach the support layer PLT to the protective layer SCV.

The heat dissipation layer EMS may be disposed under the protective layer SCV. The heat dissipation layer EMS may be a thermal conductive sheet with high thermal conductivity. The heat dissipation layer EMS may be a graphite sheet. According to the present disclosure, the electronic device ED may include the heat dissipation layer EMS, and thus, the heat dissipation performance of the electronic device ED may be improved.

According to the present embodiment, the heat dissipation layer EMS may include flat portions EF1 and EF2 respectively overlapping the first and second non-folding areas NFA1 and NFA2, and a rolling portion ER overlapping the folding area FA and disposed between the flat portions EF1 and EF2. The flat portions EF1 and EF2 respectively extend from the rolling portion ER, in a direction away from the folding area FA.

The rolling portion ER may be rolled in a predetermined direction in the state in which the electronic device ED is unfolded (refer to FIG. 1A) and may be unrolled in the state in which the electronic device ED is folded (refer to FIG. 1B). When the electronic device ED is unfolded, a shape of the rolling portion ER may be folded into an angular shape or rolled into a curved shape with a predetermined curvature, however, should not be particularly limited. That is, the display module DM which is folded disposes the rolling portion ER unrolled, and the display module DM which is unfolded disposes the rolling portion ER rolled.

As the heat dissipation layer EMS includes the rolling portion ER overlapping the folding area FA, the shape of the heat dissipation layer EMS may be easily changed when the electronic device ED is folded. Accordingly, the folding characteristics of the electronic device ED may be improved.

An eighth adhesive layer AL8 may attach the protective layer SCV to the heat dissipation layer EMS and the heat dissipation layer EMS to the metal plates MP. The eighth adhesive layer AL8 may be disposed at upper and lower surfaces of each of the flat portions EF1 and EF2 of the heat dissipation layer EMS to attach the heat dissipation layer EMS to the protective layer SCV and the metal plates MP. According to an embodiment, the eighth adhesive layer AL8 may not overlap the folding area FA. That is, the eighth adhesive layer AL8 may be disconnected at the folding area FA. Accordingly, the shape of the rolling portion ER overlapping the folding area FA may be easily changed without interference by the eighth adhesive layer AL8, when being folded or unfolded.

The metal plates MP may be spaced apart from each other with the rolling portion ER interposed therebetween in (or along) the second direction DR2. Accordingly, the metal plates MP may be spaced apart from each other with at least a portion of the folding area FA interposed therebetween in the second direction DR2. That is the metal plates MP are disconnected from each other at the folding area FA. Therefore, the rolling portion ER may be easily disposed between the metal plates MP in the state in which the electronic device ED is unfolded. In addition, the metal plates MP may reduce or effectively prevent the area of the support layer PLT where the openings OP are defined from being deformed due to a pressure applied thereto from the above.

Each of the metal plates MP may include a metal material such as stainless steel. In an embodiment, for example, the metal plates MP may include SUS 304, however, should not be limited thereto or thereby, and the metal plates MP may include a variety of metal materials.

The gap tape TP may be disposed between the protective layer SCV and the metal plates MP to compensate for a step difference of the heat dissipation layer EMS relative to the protective layer SCV and the metal plates MP. Accordingly, the gap tape TP may be disposed along an edge of the heat dissipation layer EMS and spaced apart from the heat dissipation layer EMS in a direction along the protective layer SCV. The gap tape TP may include the same material as the adhesive layers AL1 to AL8 and may be provided in a plurality of layers.

As an example, the gap tape TP may include a tape base layer, an upper adhesive layer disposed on an upper surface of the tape base layer and attached to the protective layer SCV, and a lower adhesive layer disposed on a lower surface of the tape base layer and attached to a corresponding metal plate MP.

FIG. 4 is an exploded perspective view showing an embodiment of an arrangement of the bezel pattern EB, the window module WM, and the display module DM. Referring to FIG. 4, the display module DM may include a first area A1 and a second area A2 which is distinguished from the first area A1. The first area A1 may include the active area AA and a portion of the peripheral area NAA, and the second area A2 may include the other portion of the peripheral area NAA (e.g., a remaining portion of the peripheral area NAA). The second area A2 may be bendable with respect to the first area A1, without being limited thereto.

A driving chip DIC may be disposed in the second area A2 of the display module DM. The driving chip DIC may include driving elements, e.g., a data driver, to drive pixels PX of the display panel DP. FIG. 4 shows a structure in which the driving chip DIC is mounted on the display module DM, however, the present disclosure should not be limited thereto or thereby. As an example, the driving chip DIC may be mounted on a circuit board FCB (refer to FIG. 5) described later.

The second area A2 may be defined as an area of the display module DM to which the circuit board FCB is attached, and the second area A2 is bendable in a direction toward a rear surface of the display module DM. That is, the second area A2 of the display module DM may be bent together with the circuit board FCB, in a direction toward the metal plate MP. In an embodiment, the display module DM which is folded disposes the circuit board FCB facing the metal plates MP.

The first area A1 may include the first non-folding area NFA1, the folding area FA, and a first portion of the second non-folding area NFA2, which are described with reference to FIG. 1A, and the second area A2 may include a second portion (e.g., remaining portion) of the second non-folding area NFA2.

The display module DM may be provided with a hole HL overlapping the active area AA. The hole HL may be formed (or defined) through thicknesses of the display panel DP (e.g., first hole) and the input sensing panel IS (e.g., second hole which corresponds to the first hole of the display panel DP) described with reference to FIG. 3A. A position of the signal transmission area TA described with reference to FIG. 1A may correspond to the hole HL in the active area AA. Accordingly, in a case where the hole HL is provided in plural or has an oval shape, the signal transmission area TA may be provided in plural to respectively correspond to the number of the holes HL and may have a planar shape to correspond to that of the hole HL.

Electronic modules which provide a function to the electronic device ED may be disposed under the display module DM to overlap the hole HL. As the electronic modules, at least one of a camera module that takes a picture of an external object using a visible light passing through the hole HL and a proximity sensor module that determines an approach of an external object using an infrared light, may be disposed corresponding to the hole HL. The electronic modules may be mounted on a mother board (not shown) and may be connected to a power supply module (not shown).

The window module WM may include the window protective layer PF and the light blocking pattern BP which is disposed under the window protective layer PF.

The window protective layer PF may include a cover portion CV and a protrusion portion PM. The cover portion CV may overlap the first area A1 of the display module DM, and the protrusion portion PM may be protruded from one side of the cover portion CV adjacent to (e.g., closest to) the second area A2 to the second direction DR2. Accordingly, the protrusion portion PM may overlap at least a portion of the first area A1 and the second area A2.

As the protrusion portion PM overlaps a portion of the second area A2 where the display module DM is bendable, a path of external static electricity entering the display module DM may be blocked. This will be described in detail later.

The light blocking pattern BP may include a first pattern BH (e.g., first light blocking pattern) and a second pattern BE (e.g., second light blocking pattern). The first pattern BH may be disposed along an edge of the cover portion CV and may be spaced apart from the protrusion portion PM. The second pattern BE may surround at least a portion of the hole HL. The second pattern BE may cover the area where wirings, which connect the components disconnected from each other with the hole HL interposed therebetween in the process of forming the hole HL among the pixels PX included in the display panel DP or the sensing electrodes included in the input sensing panel IS, are arranged. The shape and the number of the second patterns BE may correspond to those of the hole HL, or the second pattern BE may be omitted.

Figure 5:
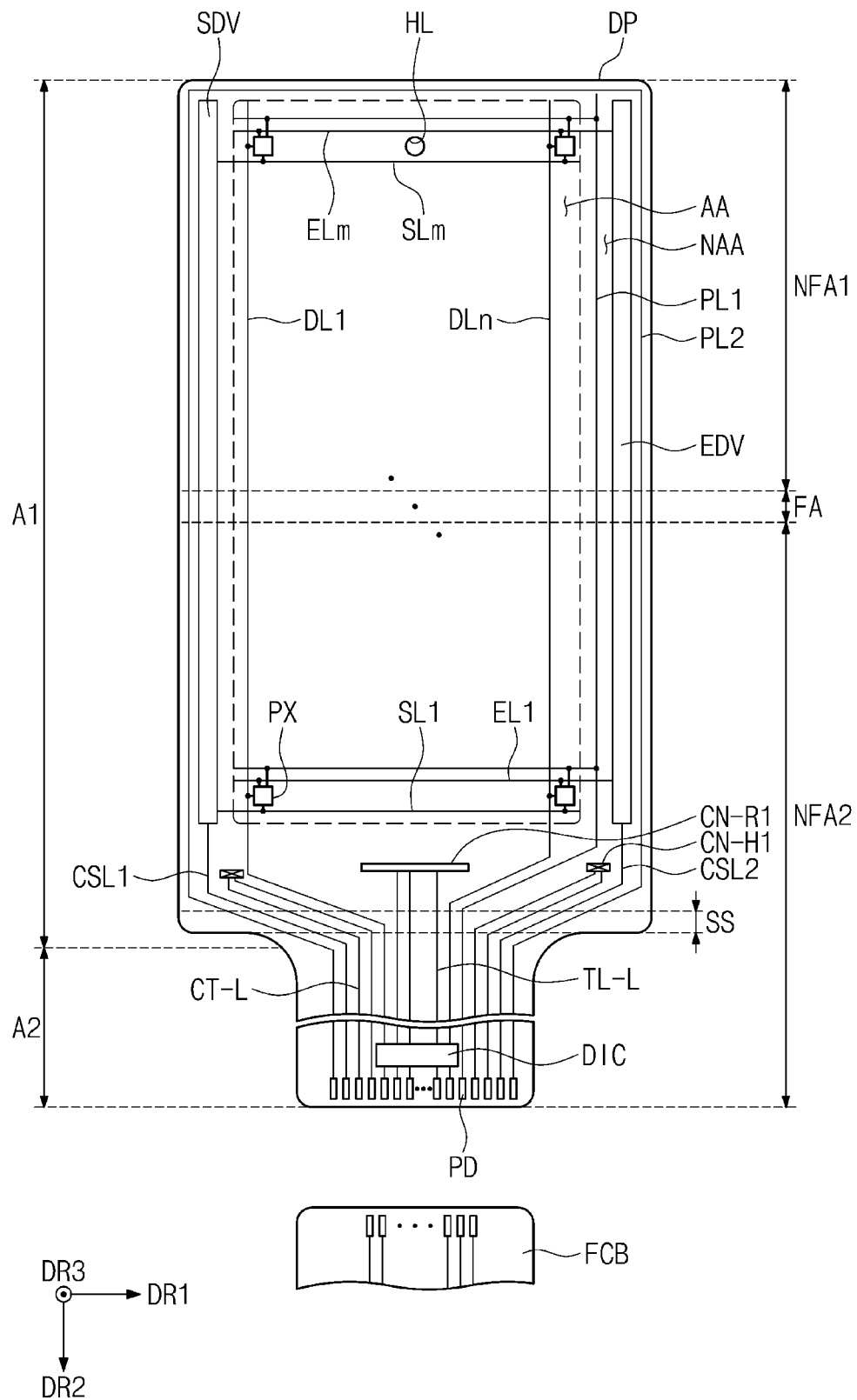
FIG. 5 is a plan view showing an embodiment of a display panel.
Figure 6:
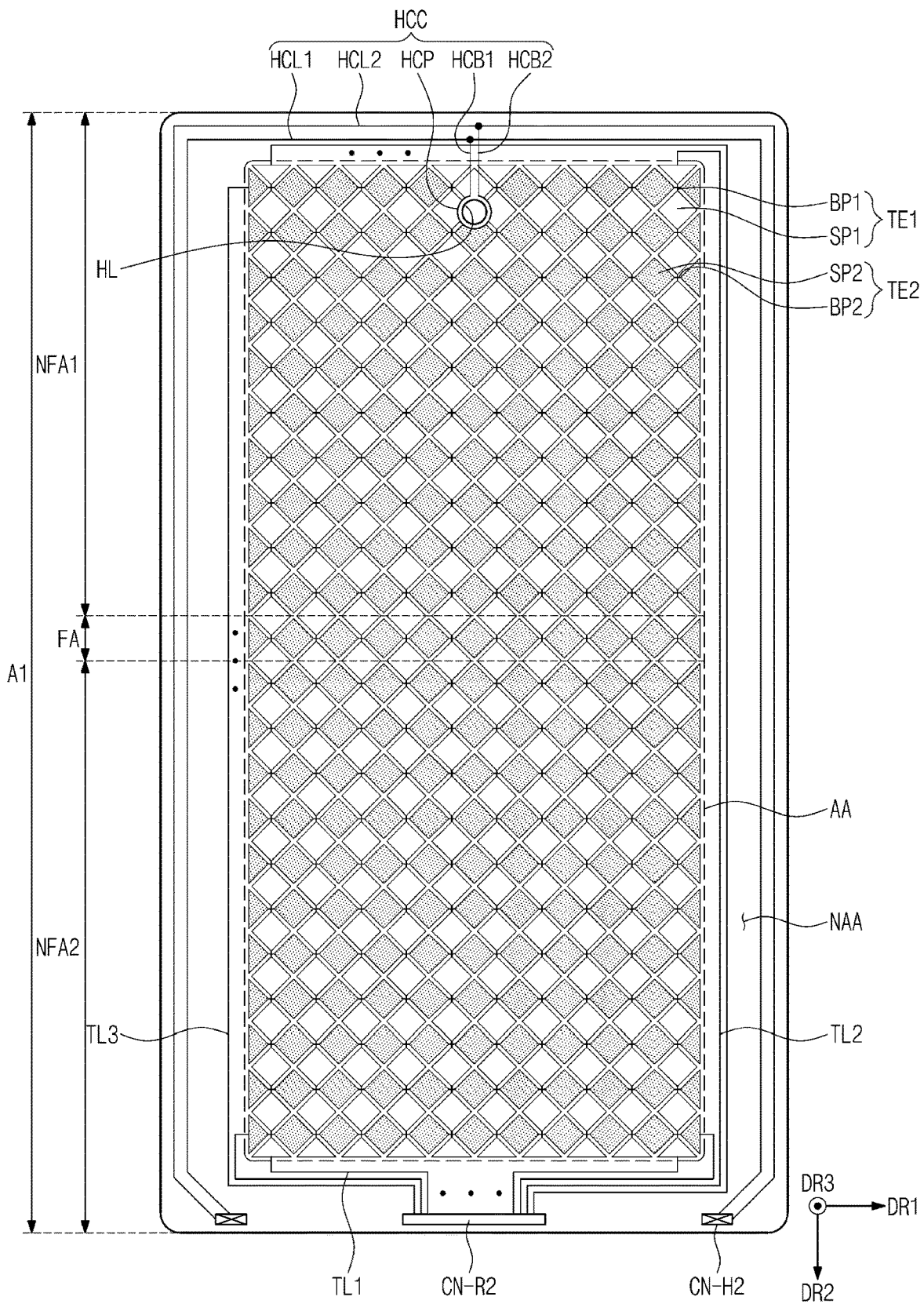
FIG. 6 is a plan view showing an embodiment of an input sensing panel.

FIG. 5 is a plan view showing an embodiment of the display panel DP, and FIG. 6 is a plan view showing an embodiment of the input sensing panel IS. In FIGS. 5 and 6, the same/similar reference numerals denote the same/similar elements in FIGS. 1A to 4, and thus, detailed descriptions of the same elements will be omitted.

Referring to FIG. 5, the display panel DP may include an active area AA and a peripheral area NAA which is adjacent to the active area AA. The active area AA and the peripheral area NAA may be distinguished from each other by the presence or absence of a pixel PX. According to the present embodiment, the display panel DP may be provided with the hole HL defined through the display panel DP to overlap the active area AA.

The active area AA and the peripheral area NAA may respectively correspond to the active area AA and the peripheral area NAA, which are described with reference to FIG. 1A. In the present disclosure, the expression "an area/portion corresponds to another area/portion" means that "an area/portion overlaps another area/portion", and the areas and the portions should not be limited to have the same size as each other.

A scan driver SDV, an emission driver EDV, and the driving chip DIC may be disposed in the peripheral area NAA. The driving chip DIC may be the data driver.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, and a pad provided in plural including a plurality of pads PD. Each of 'm' and 'n' may be a natural number. The pixels PX may be connected to the scan lines SL1 to SLm, the data lines DL1 to DLn, and the emission lines EL1 to ELm.

The scan lines SL1 to SLm may extend in the first direction DR1 and may be connected to the scan driver SDV. The data lines DL1 to DLn may extend in the second direction DR2 and may be connected to the driving chip DIC disposed in the second area A2, via the first area A1. The emission lines EL1 to ELm may extend in the first direction DR1 and may be connected to the emission driver EDV.

The first power line PL1 may include a portion extending in the first direction DR1 and a portion extending in the second direction DR2. The portion extending in the first direction DR1 and the portion extending in the second direction DR2 may be disposed on different layers from each other among layers within the display panel DP. As being "in a same layer" or "on a same layer," elements may be respective patterns of a same single layer, while elements "in different layers" or "on different layers" may be respective patterns of different single layers. The portion of the first power line PL1 which extends in the second direction DR2, may extend to the second area A2 via the first area A1. The first power line PL1 may apply a first voltage to the pixels PX.

The second power line PL2 (e.g., referred to as a second line or second signal line in the claims) may be disposed along an edge of the first area A1 in the peripheral area NAA.

The second power line PL2 may be positioned outside the scan driver SDV and the emission driver EDV. The second power line PL2 may be disposed at an outermost position in the second area A2.

The first control line CSL1 may be connected to the scan driver SDV and may extend to the second area A2 via the first area A1. The second control line CSL2 may be connected to the emission driver EDV and may extend to the second area A2 via the first area A1.

When viewed in a plane, the pads PD may be disposed adjacent to an end of the second area A2 (e.g., a distal end of the display panel DP). The driving chip DIC, the first power line PL1, the second power line PL2, the first control line CSL1, and the second control line CSL2 may be connected to the pads PD. The circuit board FCB may be connected to the display panel DP at the end of the second area A2 of the display panel DP. The circuit board FCB may include board pads corresponding to the pads PD of the display panel DP and may be electrically connected to the pads PD such as via an anisotropic conductive adhesive layer.

Each of the pixels PX may include a light emitting element and a pixel driving circuit which controls an emission (e.g., light emission) of the light emitting element. The pixel driving circuit may include a plurality of transistors and at least one capacitor.

The display panel DP may include a first contact hole CN-H1 and a second contact hole CN-R1, which are defined in the first area A1. The display panel DP may include a contact line CT-L (e.g., referred to as a first line or first signal line in the claims) extending from the first contact hole CN-H1 to the second area A2, via the first area A1. The contact line CT-L may be connected to a crack sensing line HCC (refer to FIG. 6) of the input sensing panel IS described later.

In addition, the display panel DP may include extension sensing lines TL-L extending from the second contact hole CN-R1 to the second area A2, via the first area A1. The extension sensing lines TL-L may be connected to corresponding sensing lines among sensing lines TL1, TL2, and TL3 in a one-to-one correspondence.

According to an embodiment, the second power line PL2 may be disposed closer to an outer edge of the display panel DP than the contact line CT-L, and the data lines DL1 to DLn may be spaced apart from the second power line PL2 with the contact line CT-L interposed therebetween.

In addition, signal lines connected to a driving element to drive the pixel PX may be disposed between the second power line PL2 and the contact line CT-L.

FIG. 5 shows a structure in which the extension sensing lines TL-L are disposed between the data lines DL1 to DLn, however, the present disclosure should not be limited thereto or thereby. According to an embodiment, the data lines DL1 to DLn may be disposed between the extension sensing lines TL-L, and thus, the second contact hole CN-R1 may be provided in plural such that the data lines DL1 to DLn are disposed between the second contact holes CN-R1, and should not be particularly limited.

Referring to FIG. 6, the input sensing panel IS may include a sensing electrode provided in plural including a plurality of sensing electrodes TE1 and TE2, a sensing line provided in plural including a plurality of the sensing lines TL1, TL2, and TL3, and the crack sensing line HCC. A sensing line may be connected to a sensing electrode. In a case where the input sensing panel IS is disposed directly on the display panel DP through successive processes, the input sensing panel IS may be formed only in an area overlapping the first area A1 of the display panel DP.

The input sensing panel IS may obtain information about the external input based on a variation in capacitance between first sensing electrodes TE1 and second sensing electrodes TE2.

The first sensing electrodes TE1 may be arranged in the first direction DR1 and may extend in the second direction DR2. Each of the first sensing electrodes TE1 may include a first sensing pattern SP1 and a first connection pattern BP1.

The first sensing pattern SP1 may be disposed in the active area AA. The first sensing pattern SP1 may have a lozenge shape, however, this is merely one example. According to an embodiment, the first sensing pattern SP1 may have a variety of shapes, and should not be particularly limited.

The first connection pattern BP1 may be disposed in the active area AA. The first connection pattern BP1 may be disposed between first sensing patterns SP1 adjacent to each other. The first connection pattern BP1 may be disposed on a layer different from a layer on which the first sensing pattern SP1 is disposed (e.g., in different layers from each other) and may be connected to the first sensing pattern SP1 via a contact hole.

The second sensing electrodes TE2 may be arranged in the second direction DR2 and may extend in the first direction DR1. Each of the second sensing electrodes TE2 may include a second sensing pattern SP2 and a second connection pattern BP2.

The second sensing pattern SP2 may be spaced apart from the first sensing pattern SP1 in a plan view. The first sensing pattern SP1 and the second sensing pattern SP2 may not be in contact with each other and may transmit and receive independent electrical signals.

According to the present embodiment, the second sensing pattern SP2 may have substantially the same shape as that of the first sensing pattern SP1. In an embodiment, for example, the second sensing pattern SP2 may have the lozenge shape, however, this is merely one example. According to an embodiment, the second sensing pattern SP2 may have a variety of shapes, and should not be particularly limited.

The second connection pattern BP2 may be disposed between the second sensing patterns SP2 adjacent to each other. For the convenience of explanation, the second sensing electrode TE2 is described as being divided into the second sensing pattern SP2 and the second connection pattern BP2, however, the second sensing electrode TE2 may be provided as substantially one pattern. The second sensing electrode TE2 may be disposed on the same layer as the first sensing pattern SP1.

The first sensing pattern SP1 and the second sensing electrode TE2, which are disposed on the same layer, may be provided as a plurality of mesh lines extending in an oblique direction relative to each of the first direction DR1 and the second direction DR2. Mesh lines may be defined by solid portions of a respective sensing pattern or respective sensing electrode, which are spaced apart from each other, to define a mesh shape in the plan view.

The sensing lines TL1, TL2, and TL3 may be disposed in the peripheral area NAA. The sensing lines TL1, TL2, and TL3 may include first sensing lines TL1, second sensing lines TL2, and third sensing lines TL3.

The first sensing lines TL1 may be connected to the first sensing electrodes TE1, respectively. In the present embodiment, the first sensing lines TL1 may be connected to lower ends among opposing ends of the first sensing electrodes TE1, respectively.

The second sensing lines TL2 may be connected to upper ends among the opposing ends of the first sensing electrodes TE1, respectively. According to an embodiment, each of the first sensing electrodes TE1 may be connected to a corresponding first sensing line TL1 among the first sensing lines TL1 and a corresponding second sensing line TL2 among the second sensing lines TL2. Accordingly, a sensitivity of the first sensing electrodes TE1, which have a relatively longer length compared with the second sensing electrodes TE2, may be uniformly maintained in any area of the first sensing electrodes TEL According to an embodiment, the second sensing lines TL2 of the input sensing panel IS may be omitted, and should not be particularly limited.

The third sensing lines TL3 may be connected to first ends of the second sensing electrodes TE2, respectively. In the present embodiment, the third sensing lines TL3 may be connected to left ends among opposing ends of the second sensing electrodes TE2, respectively.

The input sensing panel IS may include third and fourth contact holes CN-H2 and CN-R2 overlapping the peripheral area NAA. The third contact hole CN-H2 may overlap the first contact hole CN-H1 of the display panel DP, and the fourth contact hole CN-R2 may overlap the second contact hole CN-R1 of the display panel DP. That is, the third contact hole CN-H2 may be aligned with the first contact hole CN-H1 of the display panel DP (e.g., together define a contact hole), and the fourth contact hole CN-R2 may be aligned with the second contact hole CN-R1 of the display panel DP (e.g., together define a contact hole).

The sensing lines TL1, TL2, and TL3 may be connected to corresponding extension sensing lines TL-L via the fourth contact hole CN-R2 defined through the input sensing panel IS and the second contact hole CN-R1 defined through the display panel DP. Accordingly, the sensing electrodes TE1 and TE2 may be connected to the circuit board FCB, via extension sensing lines TL-L.

The second contact hole CN-R1 and the fourth contact hole CN-R2 may be provided for each of corresponding sensing lines TL1, TL2, and TL3, and thus, the sensing lines TL1, TL2, and TL3 adjacent to each other may be insulated from each other in the contact hole.

According to an embodiment, the input sensing panel IS may further include the crack sensing line HCC. The crack sensing line HCC may receive electrical signals independent from the electrical signals to the first sensing electrodes TE1 and the second sensing electrodes TE2. The crack sensing line HCC may include a crack sensing pattern HCP, crack sensing lines HCL1 and HCL2, and connection lines HCB1 and HCB2, which are connected to each other.

The crack sensing pattern HCP may extend along the hole HL such as to surround at least a portion of the hole HL. The crack sensing pattern HCP may have an open-curve shape including a first end and a second end which opposes the first end. The crack sensing pattern HCP may be disposed on the same layer as one of the first sensing pattern SP1 and the first connection pattern BP1.

The crack sensing lines HCL1 and HCL2 may be disposed in the peripheral area NAA. In the present embodiment, the crack sensing lines HCL1 and HCL2 may be disposed outside the first, second, and third sensing lines TL1, TL2, and TL3 in the peripheral area NAA. The crack sensing lines HCL1 and HCL2 may include a first crack sensing line HCL1 and a second crack sensing line HCL2. The first crack sensing line HCL1 and the second crack sensing line HCL2 may be disposed to be spaced apart from each other.

A first end of each of the first crack sensing line HCL1 and the second crack sensing line HCL2 may extend to the third contact hole CN-H2 defined on a left side, and a second end which is opposite to the first end of each of the first crack sensing line HCL1 and the second crack sensing line HCL2 may extend to the third contact hole CN-H2 defined on a right side. The first and second ends of each of the first crack sensing line HCL1 and the second crack sensing line HCL2 may be connected to different pads from each other among the plurality of pads PD.

The connection lines HCB1 and HCB2 may be connected to corresponding crack sensing lines HCL1 and HCL2 and may extend to the active area AA, via the peripheral area NAA.

A first connection line HCB1 may connect the first crack sensing line HCL1 to the crack sensing pattern HCP. A second connection line HCB2 may connect the second crack sensing line HCL2 to the crack sensing pattern HCP.

According to the present disclosure, damage such as cracks in the hole HL or at the peripheral area NAA may be determined through the crack sensing line HCC. In the crack sensing line HCC, first ends of the first crack sensing line HCL1 and the second crack sensing line HCL2 may serve as input terminals, and other ends of the first crack sensing line HCL1 and the second crack sensing line HCL2 may serve as output terminals.

As an example, when a signal detected at each of the output terminals is determined as defective, that is, when the detected signal has a level lower than a level of the signal provided to the input terminals or a zero level, it is highly likely that both the crack sensing lines HCL1 and HCL2 may be damaged or the crack sensing pattern HCP may be damaged. Through this, whether the cracks occur in the hole HL may be determined.

According to the present disclosure, as the input sensing panel IS further includes the crack sensing line HCC, the occurrence of defects around the hole HL may be easily detected. Accordingly, a reliability of the electronic device ED may be improved, the defects of the electronic device ED may be easily determined without a separate inspection circuit or device, and thus, a process efficiency may be improved.

According to the present disclosure, the first crack sensing line HCL1 and the second crack sensing line HCL2 may be connected to the contact line CT-L disposed in the display panel DP via the third contact hole CN-H2 defined through the input sensing panel IS and the first contact hole CN-H1 defined through the display panel DP. The contact line CT-L may be provided in plural, insulated from each other, and connected to different pads from each other to allow opposing ends of each of the first line HCL1 and the second line HCL2 to respectively serve as an input electrode and an output electrode.

According to the present disclosure, a separation area SS may be defined within the first area A1, at a location which is adjacent to the second area A2 of the display panel DP. The separation area SS may be defined as a space between an end of the optical film LF which is closest to the second area A2 and an end of a bending cover layer BPL which faces the end of the optical film LF and is closest to the first area A1.

In addition, in a case where the optical film LF is omitted from the electronic device ED, the separation area SS may be disposed between the window module WM and the display module DM and may be defined as an area between the end of the bending cover layer BPL and an end of the adhesive layer which faces the end of the bending cover layer BPL. In this case, the adhesive layer may overlap at least a portion of the first area A1.

When viewed in a plane, the second power line PL2, the contact line CT-L, the extension sensing lines TL-L, the data lines DL1 to DLn, and signal lines used to drive the pixel PX may overlap the separation area SS.

Figure 7A:
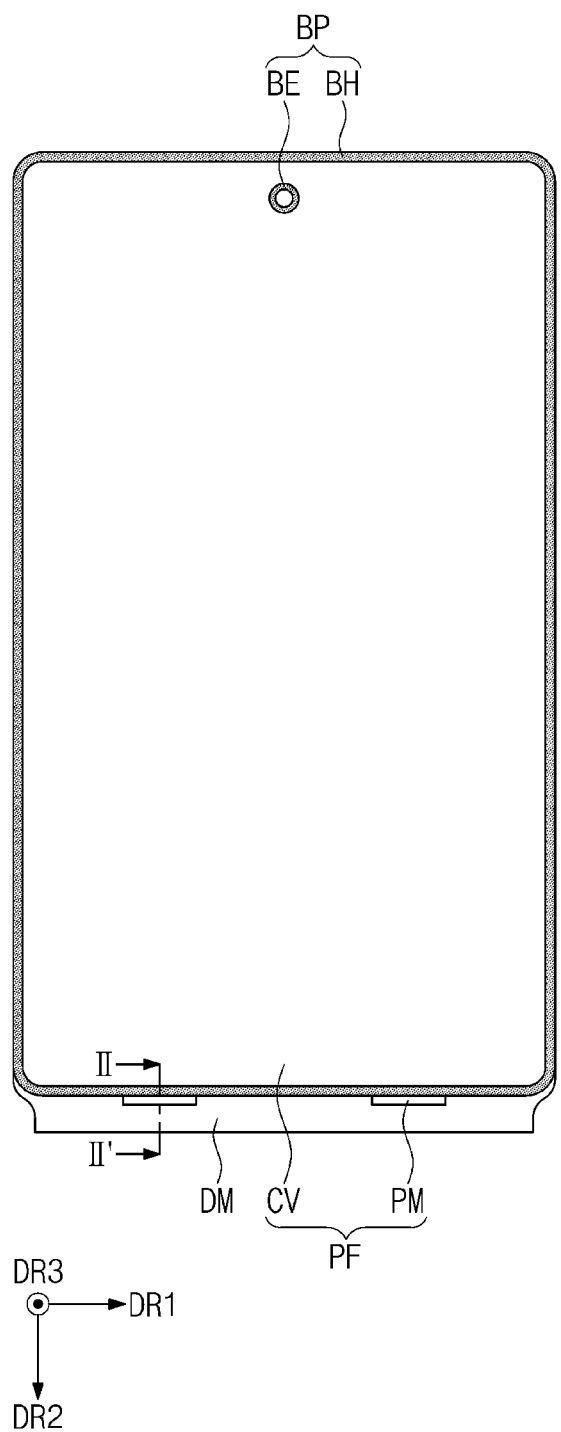
FIG. 7A is a plan view showing an embodiment of a window module relative to a display module.
Figure 7B:
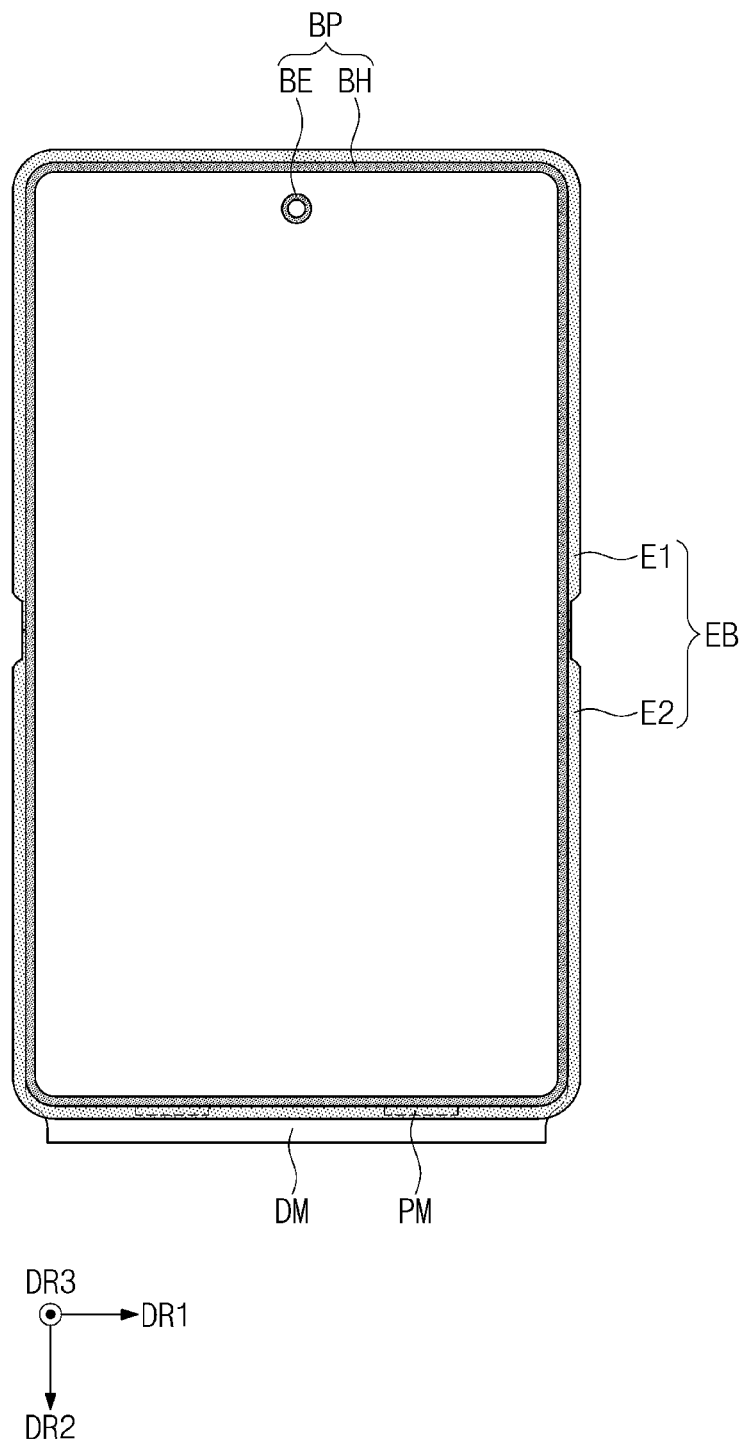
FIG. 7B is a plan view showing an embodiment of a bezel pattern relative to a window module and a display module.
Figure 8:
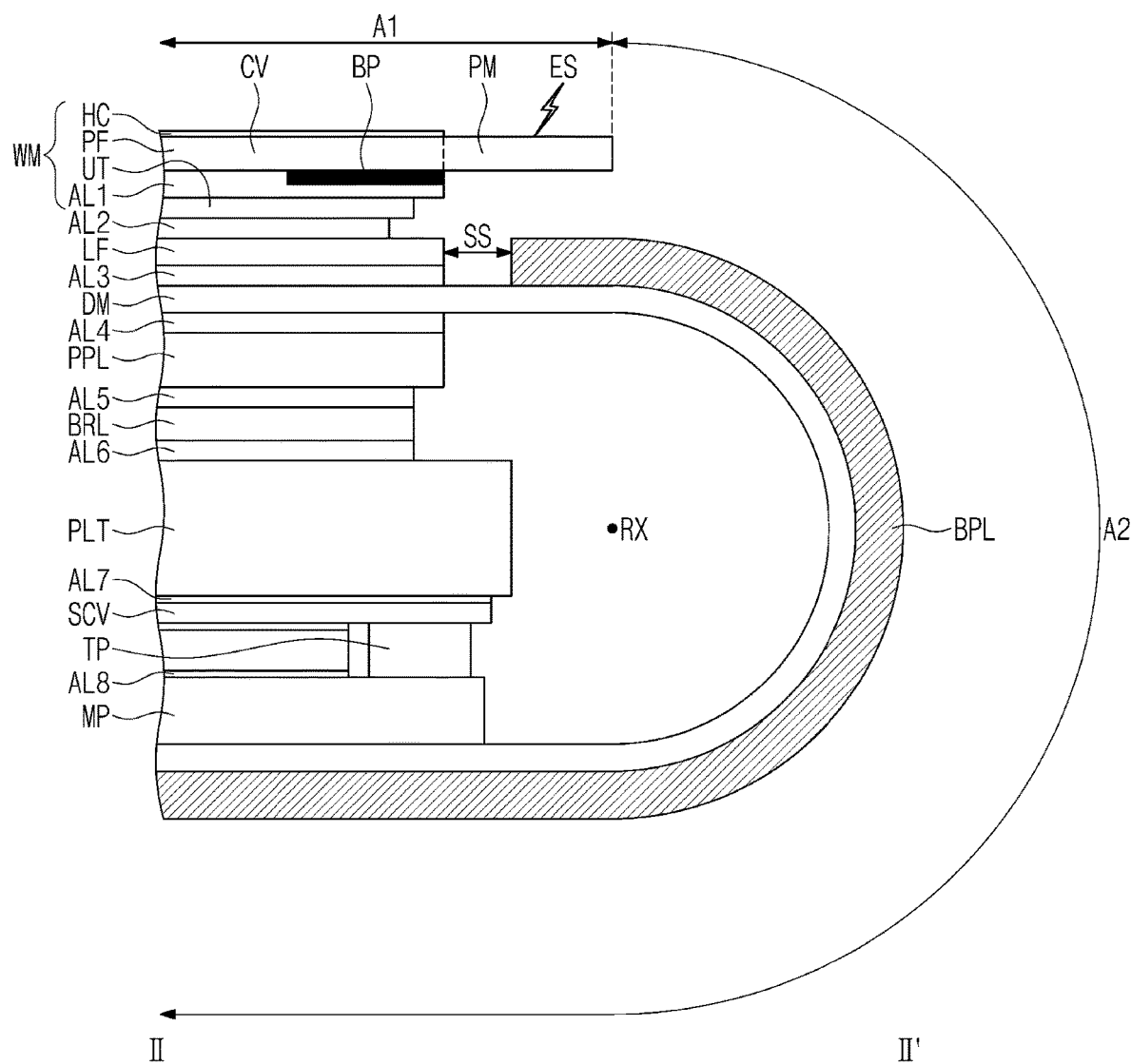
FIG. 8 is a cross-sectional view taken along line I-I' of FIG. 7A.
Figure 9:
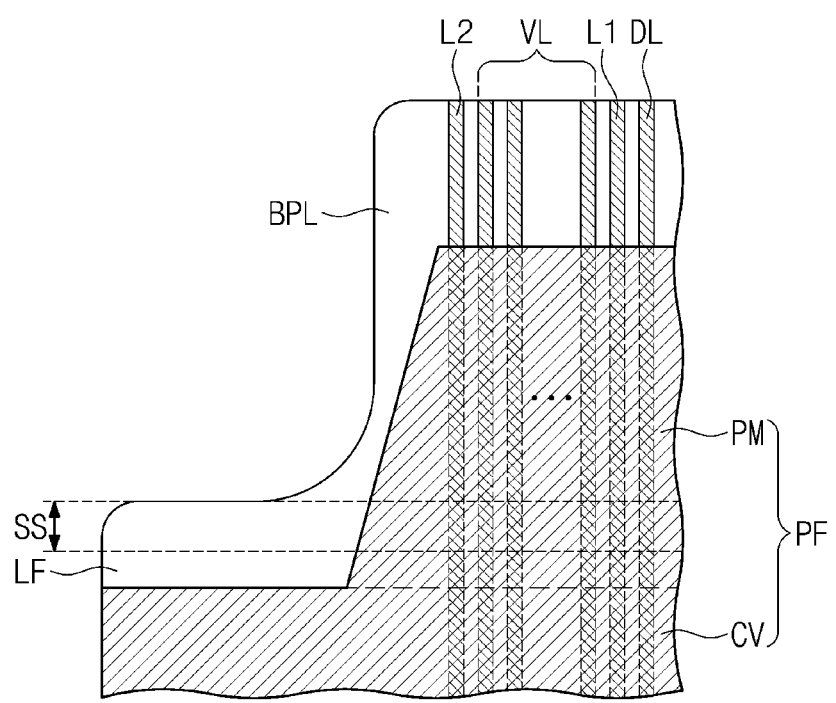
FIG. 9 is an enlarged plan view showing an embodiment of a portion of a window module and a display panel.

FIG. 7A is a plan view showing an embodiment of a positional relationship between the window module WM and the display module DM. FIG. 7B is a plan view showing an embodiment of a positional relationship between the bezel pattern EB, the window module WM, and the display module DM. FIG. 8 is a cross-sectional view taken along line I-I' of FIG. 7A. FIG. 9 is an enlarged plan view showing an embodiment of a portion of the window module WM and the display panel DP. In FIGS. 7A to 9, the same/similar reference numerals denote the same/similar elements in FIGS. 1A to 6, and thus, detailed descriptions of the same/similar elements will be omitted.

FIGS. 7A and 7B show a relationship between the protrusion portion PM of the window module WM and the bezel pattern EB, in a state where the display module DM is bent at the second area A2 and viewed in a plane (e.g., along the thickness direction). The display module DM which is bent at the second area A2 disposes the protrusion portion PM of the window module WM overlapping the first area A1 (refer to FIG. 8) and protruded in a direction toward the second area A2 (refer to FIG. 8) from the first area A1.

As shown in FIG. 7B, the bezel pattern EB may surround an outer portion of the second pattern BE of the light blocking pattern BP when viewed in a plane. In addition, the bezel pattern EB may cover at least a portion of the second pattern BE when viewed in a plane.

According to an embodiment, the second pattern E2 of the bezel pattern EB may cover at least a portion of the protrusion portion PM, as indicated by the dotted outline of the protrusion portion PM in FIG. 8. As an example, the second pattern E2 may cover an entirety of the protrusion portion PM, or only a portion of the protrusion portion PM may be covered by the second pattern E2 while a remaining portion of the protrusion portion PM may be covered by the case CS (refer to FIG. 1B). Thus, the protrusion portion PM may not be viewable from outside the electronic device ED.

Referring to FIG. 9, the electronic device ED may include the bending cover layer BPL disposed on the display module DM. The bending cover layer BPL may extend along an end portion of the display module DM to overlap at least a portion of the second area A2 of the display module DM. That is, a first portion of the bending cover layer BPL may overlap the first area A1 adjacent to the second area A2 (e.g., closest to the second area A2), and a second portion of the bending cover layer BPL (e.g., a remaining area) may overlap the second area A2.

The bending cover layer BPL may be bendable together with the second area A2 of the display module DM in bending of the second area A2 with respect to a bending axis RX and may protect the second area A2 of the display module DM from the external impact. In addition, the bending cover layer BPL may control a neutral surface of the second area A2 when the second area A2 is bent. That is, the bending cover layer BPL may control the stress of the second area A2 to allow the lines (e.g., signal lines, conductive lines, etc.) disposed in the second area A2 to be close to the neutral surface. The bezel pattern EB described with reference to FIGS. 7A and 7B may be disposed on the protrusion portion PM in the first area A1 to cover the protrusion portion PM.

According to the present disclosure, the separation area SS may be defined between the end of the optical film LF and the end of bending cover layer BPL which faces the end of the optical film LF.

The second power line PL2, the contact line CT-L, and the data lines DL1 to DLn may overlap the separation area SS. Among the lines shown in FIG. 9, a first line L1 may correspond to the contact line CT-L, a second line L2 may correspond to the second power line PL2, and a data line DL may correspond to one of the data lines DL1 to DLn. An included line VL (e.g., intermediate line) may correspond to one of the signal lines used to drive the pixel PX (refer to FIG. 5). The included line VL may include the first and second control lines CSL1 and CSL2 (refer to FIG. 5).

According to an embodiment, the first line L1 may be insulated from the pixel PX, and the second line L2 may be connected to the pixel. The first line L1 may be connected to the crack sensing line HCC included in the input sensing panel IS.

According to an embodiment, the second line L2 disposed at an outermost position among the lines overlapping the separation area SS (e.g., closest to an outer edge of the display module DM) may have a resistance (e.g., electrical resistance) higher than that of the first line L1 that is disposed at a relatively inner position with respect to the outer edge. Accordingly, the separation area SS of the display module DM, which is exposed to outside the optical film LF and the bending cover layer BPL without being covered by the optical film LF and the bending cover layer BPL, may be an area where a static electricity ES flowing in from the outside may be easily charged, and a defect in which the static electricity ES flows into the first line L1 having a relatively low resistance may occur.

According to an embodiment, the protrusion portion PM of the window protective layer PF may overlap the separation area SS when viewed in a plane. Accordingly, the protrusion portion PM may overlap at least a portion of the first line L1 overlapping the separation area SS.

Accordingly, as a path through which the static electricity ES flowing in from the outside travels to the first line L1 from the separation area SS is blocked, the window module WM that effectively prevents short circuits caused by the static electricity ES may be provided. Accordingly, the electrical characteristics and the folding characteristics of the electronic device ED may be improved.

The static electricity ES flowing in from the outside may be blocked from entering the display module DM by the protrusion portion PM, may be recharged in a set module such as a separate case connected to the electronic device ED, and then may be discharged to the outside via a ground line included in the electronic device ED.

FIGS. 10 to 13 are plan views showing embodiments of the window module WM. In FIGS. 10 to 13, the same/similar reference numerals denote the same/similar elements in FIGS. 1A to 9, and thus, detailed descriptions of the same/similar elements will be omitted. A light blocking pattern BP described with reference to FIGS. 10 to 13 may correspond to the first pattern BH of FIG. 4.

Figure 10:
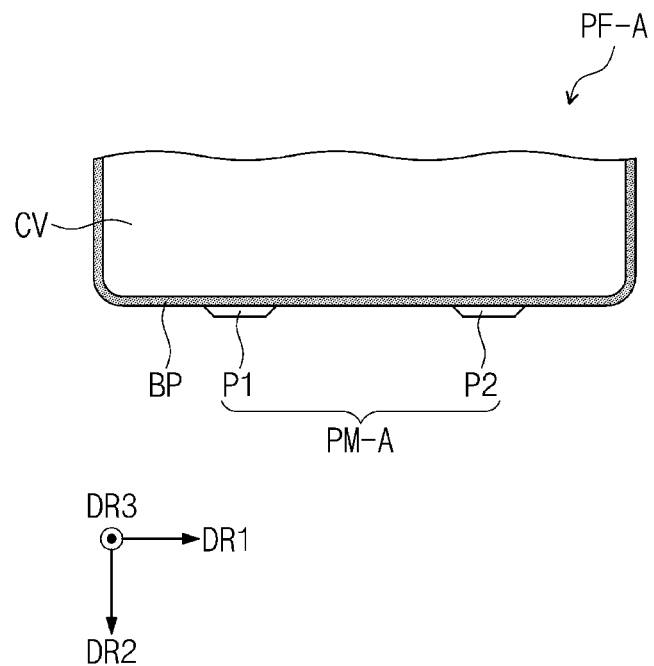
FIG. 10 is a plan view showing an embodiment of a window module.

Referring to FIG. 10, a window protective layer PF-A may include a cover portion CV and a protrusion portion PM-A.

In the present embodiment, the protrusion portion PM-A may include a first pattern P1 (e.g., first protrusion pattern) and a second pattern P2 (e.g., second protrusion pattern) which is spaced apart from the first pattern P1 in the first direction DR1. The protrusion portion PM-A may not overlap the light blocking pattern BP. That is, the protrusion portion PM-A may extend further than an outer edge of the light blocking pattern BP to be exposed outside of the light blocking pattern BP.

In the present embodiment, the first pattern P1 and the second pattern P2 may protrude from the cover portion CV to have a trapezoidal shape.

Figure 11:
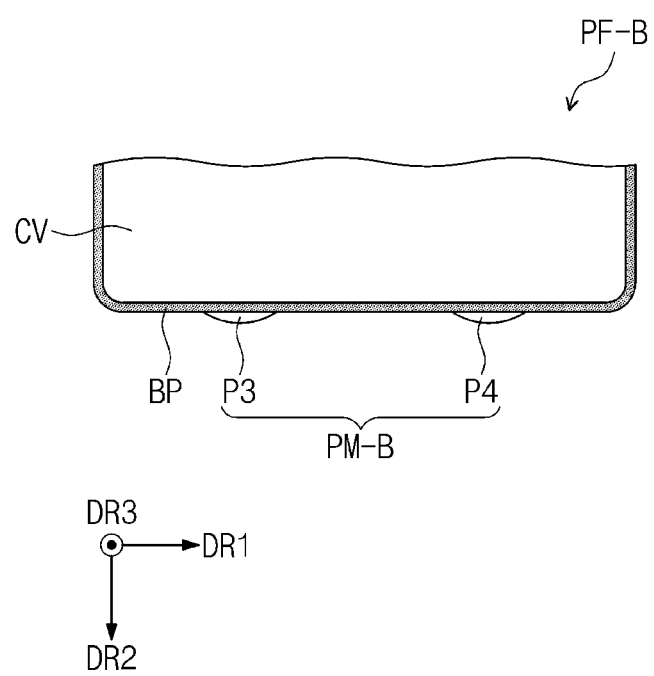
FIG. 11 is a plan view showing an embodiment of a window module.

Referring to FIG. 11, a window protective layer PF-B may include a cover portion CV and a protrusion portion PM-B.

In the present embodiment, the protrusion portion PM-B may include a third pattern P3 and a fourth pattern P4 which is spaced apart from the third pattern P3 in the first direction DR1. The protrusion portion PM-B may not overlap the light blocking pattern BP.

In the present embodiment, the third pattern P3 and the fourth pattern P4 may protrude from the cover portion CV to have a shape including a curve form (e.g., curved shape).

Referring to FIG. 12, a window protective layer PF-C may include a cover portion CV and a protrusion portion PM-C.

In the present embodiment, the protrusion portion PM-C may include one pattern extending in the first direction DR1. The protrusion portion PM-C may not overlap the light blocking pattern BP.

Referring to FIG. 13, a window protective layer PF-D may include a cover portion CV-D and a protrusion portion PM-D.

In the present embodiment, the cover portion CV-D may include a first cover portion C1 and a second cover portion C2. The first cover portion C1 may overlap a border of the light blocking pattern BP or may extend to an outer edge of the light blocking pattern BP.

The second cover portion C2 may be disposed between the first cover portion C1 and the protrusion portion PM-D and may not overlap the light blocking pattern BP. That is, both the cover portion CV-D and the protrusion portion PM-D of the window protective layer PF-D may extend further than an outer edge of the light blocking pattern BP to be exposed outside of the light blocking pattern BP.

In the present embodiment, the protrusion portion PM-D may include a first pattern P1 and a second pattern P2 which are spaced apart from each other in the first direction DR1 and protrude from the second cover portion C2 to have a trapezoidal shape.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the invention shall be determined according to the attached claims.

What is claimed is:
1. An electronic device comprising:
a display module comprising:
a display panel comprising a first area in which a pixel is disposed, a second area adjacent to the first area and bendable with respect to an imaginary axis extending in a first direction, a data line connected to the pixel, and a first line insulated from the pixel, and
an optical film overlapping at least a portion of the first area;
a bending cover layer extended along the display module and overlapping at least a portion of the second area; and
a window module disposed on the display module, the window module comprising:
a glass substrate comprising an edge closest to the second area in a second direction crossing the first direction,
a window protective layer comprising a cover portion disposed on the glass substrate, and
the window protective layer extending further than the edge of the glass substrate, in the second direction, to define a protrusion portion of the window protective layer which is protruded from the cover portion,
wherein
an end of the optical film and an end of the bending cover layer which faces the end of the optical film, define a separation area,
the data line and the first line overlap the separation area when viewed in a plane, and
the protrusion portion overlaps the first line in the separation area when viewed in a plane.

2. The electronic device of claim 1, further comprising a second line overlapping the separation area and applying a power voltage to the pixel,
wherein the second line has a resistance higher than a resistance of the first line.

3. The electronic device of claim 2, wherein
the display module further comprises an input sensing panel disposed on the display panel and comprising a sensing electrode, a sensing line connected to the sensing electrode, and a crack sensing line insulated from the sensing electrode, and
the crack sensing line is connected to the first line via a contact hole defined through the display panel and the input sensing panel.

4. The electronic device of claim 3, wherein
the first area of the display module comprises:
an active area to which a light generated by the display panel is provided and in which an external input is sensed by the input sensing panel; and
a peripheral area adjacent to the active area, and
the display module is provided with a hole overlapping the active area and penetrating through the display panel and the input sensing panel.

5. The electronic device of claim 4, wherein the crack sensing line of the input sensing panel includes:
a first portion of the crack sensing line which overlaps the peripheral area, and
a second portion of the crack sensing line which extends to the active area to surround at least a portion of the hole.

6. The electronic device of claim 4, wherein
the display module further comprises:
a folding area foldable with respect to a folding axis extending in the first direction; and
a first non-folding area and a second non-folding area spaced apart from each other with the folding area interposed therebetween in the second direction,
the first non-folding area, the folding area, and a portion of the second non-folding area corresponding to the first area of the display panel, and
a remaining portion of the second non-folding area corresponding to the second area of the display panel.

7. The electronic device of claim 2, wherein the second line is spaced apart from the data line with the first line interposed therebetween and is disposed closer to an outer position of the second area than the first line is.

8. The electronic device of claim 1, wherein the protrusion portion overlaps a portion of the bending cover layer in a plane.

9. The electronic device of claim 1, wherein the protrusion portion comprises a first pattern and a second pattern which is spaced apart from the first pattern in the first direction.

10. The electronic device of claim 1, wherein the protrusion portion has one of a quadrangular shape, a trapezoidal shape, and a shape including a curve form.

11. The electronic device of claim 1, wherein the window protective layer comprises a light blocking pattern disposed along an edge of the cover portion.

12. The electronic device of claim 11, wherein the cover portion further comprises:
a first cover portion overlapping a border of the light blocking pattern; and
a second cover portion disposed between the first cover portion and the protrusion portion, and the second cover portion does not overlap the light blocking pattern.

13. The electronic device of claim 1, further comprising:
a panel protective layer disposed under the display module;
a barrier layer disposed under the panel protective layer;
a support layer disposed under the barrier layer;
a protective layer disposed under the support layer; and
a heat dissipation layer disposed under the protective layer.

14. The electronic device of claim 13, wherein
the display module comprises a folding area defined in the first area and foldable with respect to a folding axis extending in the first direction, and non-folding areas spaced apart from each other with the folding area interposed therebetween in the second direction,
the heat dissipation layer comprises flat portions overlapping the non-folding areas, and a rolling portion which is disposed between the flat portions and rollable and unrollable, and
the rolling portion is rolled in a predetermined direction when the display module is in an unfolded state.

15. The electronic device of claim 14, further comprising metal plates disposed under the heat dissipation layer,
wherein the metal plates are spaced apart from each other with the rolling portion interposed therebetween in the second direction.

16. The electronic device of claim 15, further comprising a gap tape disposed between the protective layer and the metal plates to compensate for a step difference of the heat dissipation layer.

17. The electronic device of claim 15, further comprising a circuit board connected to the pixel,
wherein the circuit board is connected to an end of the second area spaced apart from the first area of the display panel and is bent to a direction toward the metal plates with the second area of the display panel.

18. An electronic device comprising:
a display module comprising a display panel;
the display panel comprising:
a first area comprising an active area in which a pixel is disposed and a peripheral area which is adjacent to the active area,
a second area adjacent to the first area and bendable with respect to an imaginary axis extending in a first direction,
a first line insulated from the pixel, and
a second line connected to the pixel;
a bending cover layer extended along the display module and overlapping at least a portion of the second area;
a window module disposed on the display module and comprising:
a glass substrate comprising an edge closest to the second area in a second direction crossing the first direction,
a window protective layer comprising a cover portion disposed on the glass substrate, and
the window protective layer extending further than the edge of the glass substrate, in the second direction, to define a protrusion portion of the window protective layer which is protruded from the cover portion; and
an adhesive layer overlapping at least a portion of the first area and disposed between the window module and the display module,
wherein
an end of the adhesive layer and an end of the bending cover layer which faces the end of the adhesive layer, define a separation area, the first line has a resistance lower than a resistance of the second line, the first line and the second line overlap the separation area when viewed in a plane, and the protrusion portion overlaps the first line and the second line in the separation area.

19. The electronic device of claim 18, wherein the display module comprises a data line connected to the pixel and spaced apart from the second line with the first line interposed therebetween.

20. The electronic device of claim 18, wherein
the display module further comprises an input sensing panel disposed on the display panel and comprising a sensing electrode overlapping the active area, a sensing line overlapping the peripheral area and connected to the sensing electrode, and a crack sensing line insulated from the sensing electrode, and the crack sensing line is connected to the first line via a contact hole overlapping the peripheral area and defined through the display panel and the input sensing panel.

21. The electronic device of claim 20, wherein the display module is provided with a hole overlapping the active area and penetrating through the display panel and the input sensing panel.

22. The electronic device of claim 21, wherein
a portion of the crack sensing line overlaps the peripheral area, and the other portion of the crack sensing line extends to the active area to surround at least a portion of the hole.

23. An electronic device comprising:
a display panel comprising a first area, a second area which is adjacent to the first area and bendable with respect to an imaginary axis extending in a first direction, and a contact line extending to the second area from the first area;

a window module over the display panel, the window module comprising:
a glass substrate comprising an edge closest to the second area in a second direction crossing the first direction, a window protective layer comprising a cover portion disposed on the glass substrate, and the window protective layer extending further than the edge of the glass substrate, in the second direction, to define a protrusion portion of the window protective layer which is protruded from the cover portion;

an input sensing panel disposed on the display panel and comprising a sensing electrode, a sensing line connected to the sensing electrode, and a crack sensing line connected to the contact line;

an optical film disposed on the input sensing panel and overlapping at least a portion of the first area; and a bending cover layer disposed on the display panel and overlapping at least a portion of the second area, wherein an end of the optical film and an end of the bending cover layer which faces the end of the optical film, define a separation area, the contact line overlaps the separation area when viewed in a plane, and the protrusion portion overlaps the contact line in the separation area when viewed in a plane.

24. The electronic device of claim 23, wherein
the first area comprises an active area in which a pixel is disposed, and a peripheral area adjacent to the active area, the display panel comprises a power line and a data line which are connected to the pixel and overlap the separation area, and the contact line is insulated from the pixel and has a resistance lower than a resistance of the power line.

25. The electronic device of claim 24, wherein the crack sensing line is connected to the contact line via a contact hole defined through the display panel and the input sensing panel, which overlap the peripheral area.

26. The electronic device of claim 25, wherein
a hole is defined through the display panel and the input sensing panel, which overlap the active area, a portion of the crack sensing line overlaps the peripheral area, and the other portion of the crack sensing line extends to the active area to surround at least a portion of the hole.

27. An electronic device comprising:
a display panel comprising:
a first area in which a pixel is disposed, a second area defined adjacent to the first area in a first direction and bendable with respect to an imaginary axis extending in athc first direction, a data line connected to the pixel, and a first line insulated from the pixel;

a window module comprising:
a glass substrate comprising an edge closest to the second area in a second direction crossing the first direction, a window protective layer comprising a cover portion disposed on the glass substrate, and the window protective layer extending further than the edge of the glass substrate, in the second direction, to define a protrusion portion of the window protective layer which is protruded from the cover portion;

a bezel pattern disposed on the window module along an edge of the window module;

an optical film overlapping at least a portion of the first area; and a bending cover layer overlapping at least a portion of the second area, wherein an end of the optical film and an end of the bending cover layer which face each other, define a separation area, the bezel pattern overlaps the protrusion portion, and the protrusion portion overlaps the separation area.

28. The electronic device of claim 27, wherein
the data line and the first line overlap the separation area when viewed in a plane, and the protrusion portion overlaps the first line in the separation area when viewed in a plane.

29. The electronic device of claim 28, wherein
the display panel further comprises a folding area foldable with respect to a folding axis extending in the first direction, a first non-folding area, and a second non-folding area spaced apart from the first non-folding area in the second direction with the folding area interposed therebetween, the first area comprises the first non-folding area, the folding area, and a portion of the second non-folding area, the second area comprises the other portion of the second non-folding area, and the bezel pattern comprises a first pattern overlapping the first non-folding area and a second pattern overlapping the second non-folding area.

30. The electronic device of claim 27, further comprising a second line that overlaps the separation area and applies a power voltage to the pixel,
   wherein the second line has a resistance higher than a resistance of the first line.

31. The electronic device of claim 30, further comprising an input sensing panel disposed on the display panel and comprising a sensing electrode, a sensing line connected to the sensing electrode, and a crack sensing line insulated from the sensing electrode,
   wherein the crack sensing line is connected to the first line via a contact hole defined through the display panel and the input sensing panel.

32. The electronic device of claim 27, wherein
   the window protective layer further comprises a light blocking pattern disposed along an edge of the cover portion, and
   the bezel pattern surrounds an outer portion of the light blocking pattern when viewed in a plane.

* * * * *